(12) United States Patent
Kim et al.

(10) Patent No.: US 12,057,378 B2
(45) Date of Patent: Aug. 6, 2024

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Gi Jeong Kim, Gyeonggi-do (KR); Hyeong Il Jeon, Gyeonggi-do (KR); Byong Jin Kim, Seoul (KR); Junichiro Abe, Kanagawa (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 173 days.

(21) Appl. No.: 17/544,872

(22) Filed: Dec. 7, 2021

(65) Prior Publication Data
US 2023/0178459 A1 Jun. 8, 2023

(51) Int. Cl.
*H01L 23/552* (2006.01)
*H01L 21/56* (2006.01)
(Continued)

(52) U.S. Cl.
CPC ........ *H01L 23/49541* (2013.01); *H01L 21/56* (2013.01); *H01L 23/3107* (2013.01);
(Continued)

(58) Field of Classification Search
CPC ............... H01L 23/49541; H01L 21/56; H01L 23/3107; H01L 23/49503; H01L 23/552
(Continued)

(56) References Cited

U.S. PATENT DOCUMENTS 7,960,818 B1 6/2011 David et al.
8,053,872 B1 11/2011 Swan et al.
(Continued)

*Primary Examiner* — Caleb E Henry
*Assistant Examiner* — Dilinh P Nguyen
(74) *Attorney, Agent, or Firm* — Kevin B. Jackson

(57) ABSTRACT

In one example, a packaged electronic device includes a molded substrate. The molded substrate includes a conductive structure having an edge lead with an edge lead outward side and an edge lead inward side opposite to the edge lead outward side, and an inner lead having an inner lead outward side and an inner lead inward side opposite to the inner lead outward side. The molded substrate includes a substrate encapsulant covering a lower portion of the edge lead inward side, a lower portion of the inner lead inward side, and a lower portion of the inner lead outward side. An upper portion of the edge lead outward side and an upper portion of the inner lead outward side are exposed from the substrate encapsulant. An electronic component is connected to the edge lead and the inner lead. A body encapsulant covers the electronic component and portions of the conductive structure. The body encapsulant has a body encapsulant top side and body encapsulant sides, the upper portion of the edge lead outward side is exposed from one of the body encapsulant sides, and the body encapsulant covers the upper portion of the inner lead outward side and the upper portion of the inner lead inward side. A conductive cover is over the body encapsulant top side, the body encapsulant sides, and outer sides of the substrate encapsulant. The conductive cover contacts the upper portion of the edge lead outward side. Other examples and related methods are also disclosed herein.

20 Claims, 24 Drawing Sheets

(51) Int. Cl.
*H01L 23/31* (2006.01)
*H01L 23/495* (2006.01)
*H01L 23/00* (2006.01)

(52) U.S. Cl.
CPC ...... *H01L 23/49503* (2013.01); *H01L 23/552* (2013.01); *H01L 24/16* (2013.01); *H01L 24/48* (2013.01); *H01L 2224/16245* (2013.01); *H01L 2224/48245* (2013.01)

(58) Field of Classification Search
USPC ........................................................ 257/659
See application file for complete search history.

(56) References Cited

U.S. PATENT DOCUMENTS

| | | |
|---|---|---|
| 8,736,030 B2 | 5/2014 | Yao et al. |
| 9,589,906 B2 * | 3/2017 | Lee .................. H01L 23/49541 |
| 9,997,468 B2 | 6/2018 | Han et al. |
| 10,978,779 B2 | 4/2021 | Maggay |
| 2009/0065911 A1 | 3/2009 | Wu et al. |
| 2016/0172277 A1 * | 6/2016 | Lee ..................... H01L 23/3121 |
| | | 257/676 |
| 2019/0371760 A1 | 12/2019 | Chun et al. |
| 2020/0312781 A1 | 10/2020 | Signorini et al. |

\* cited by examiner

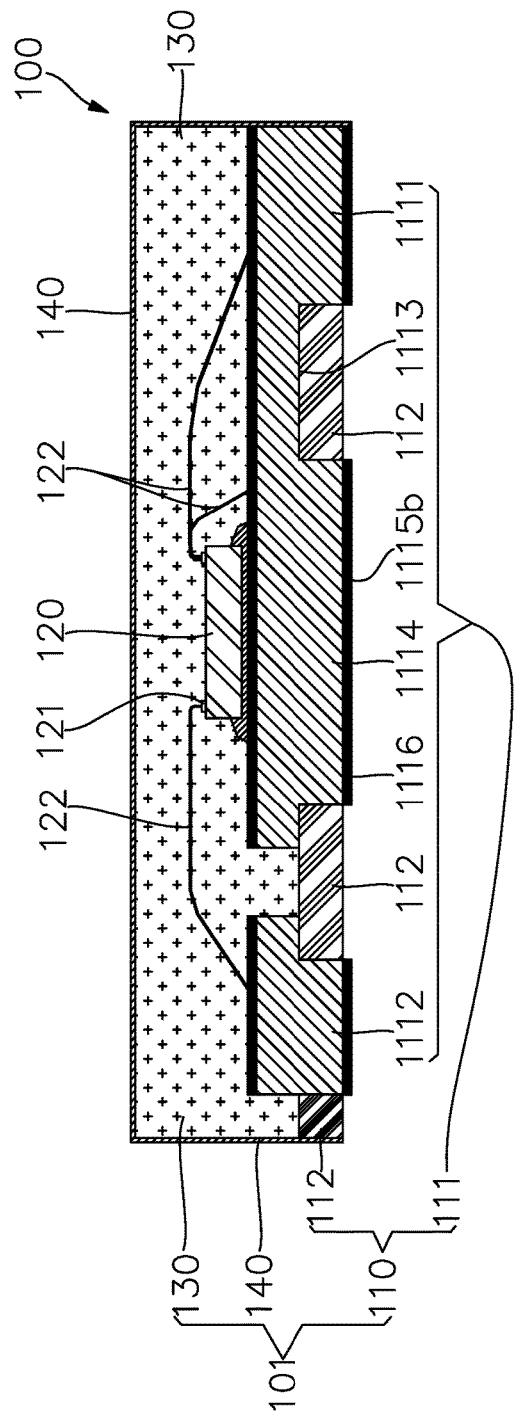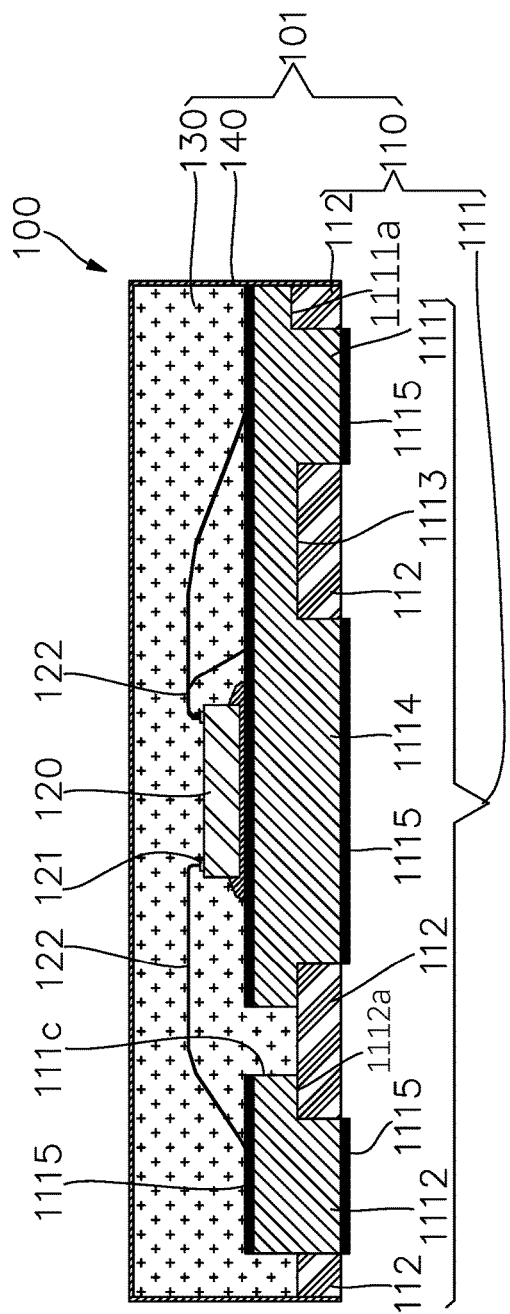

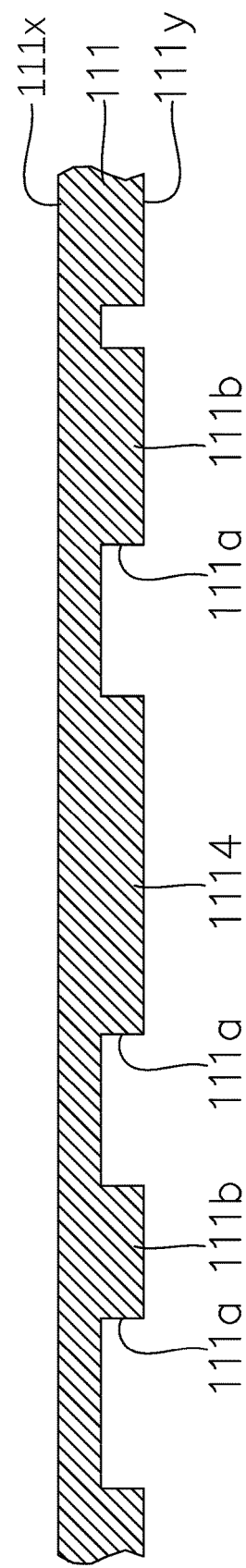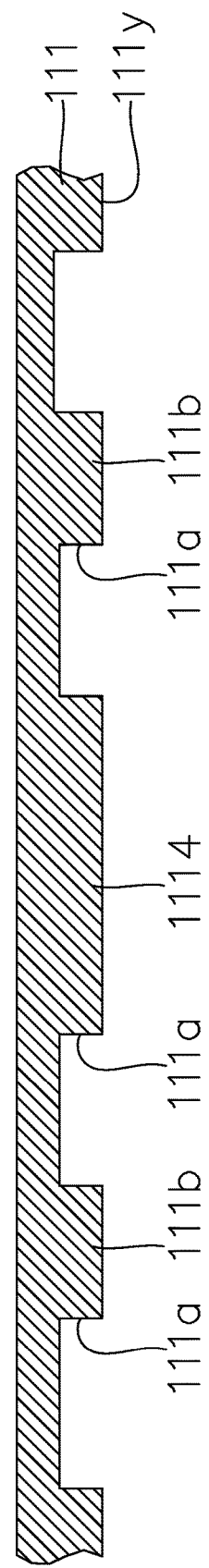

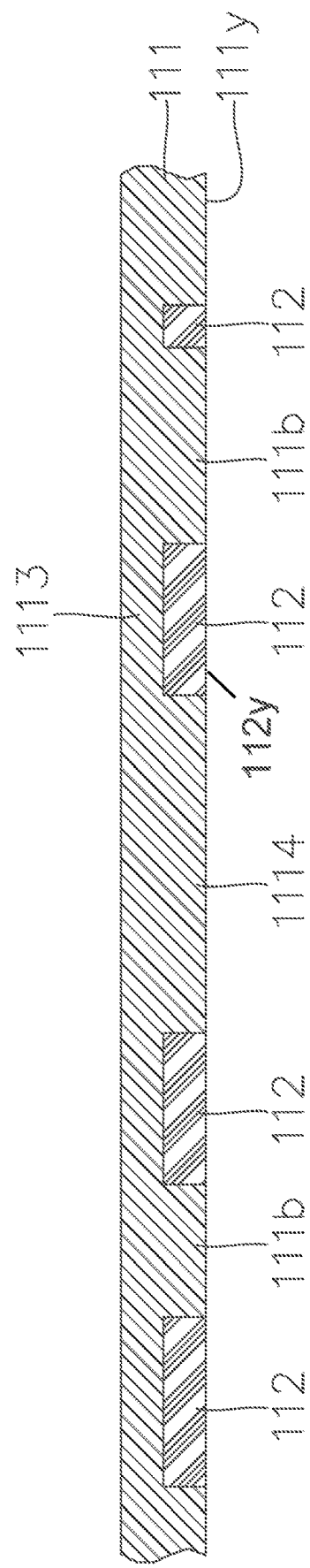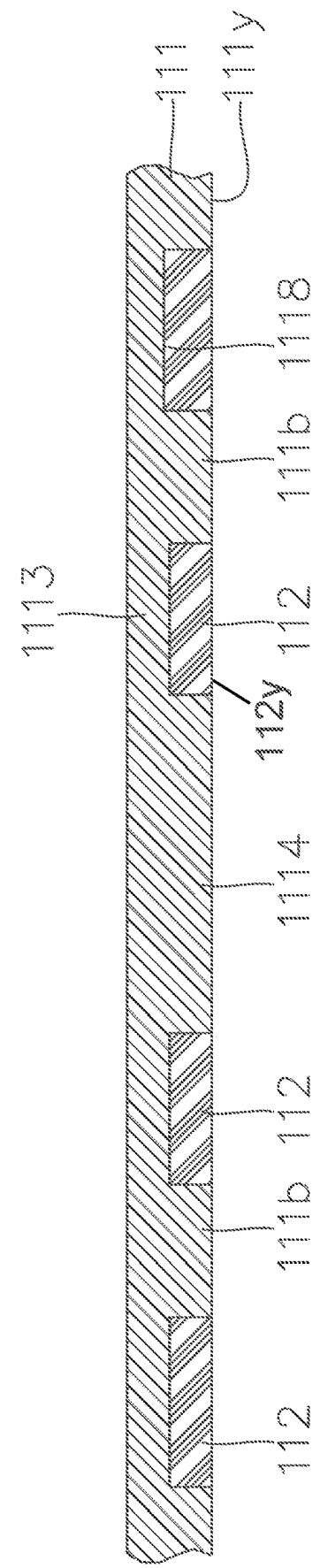

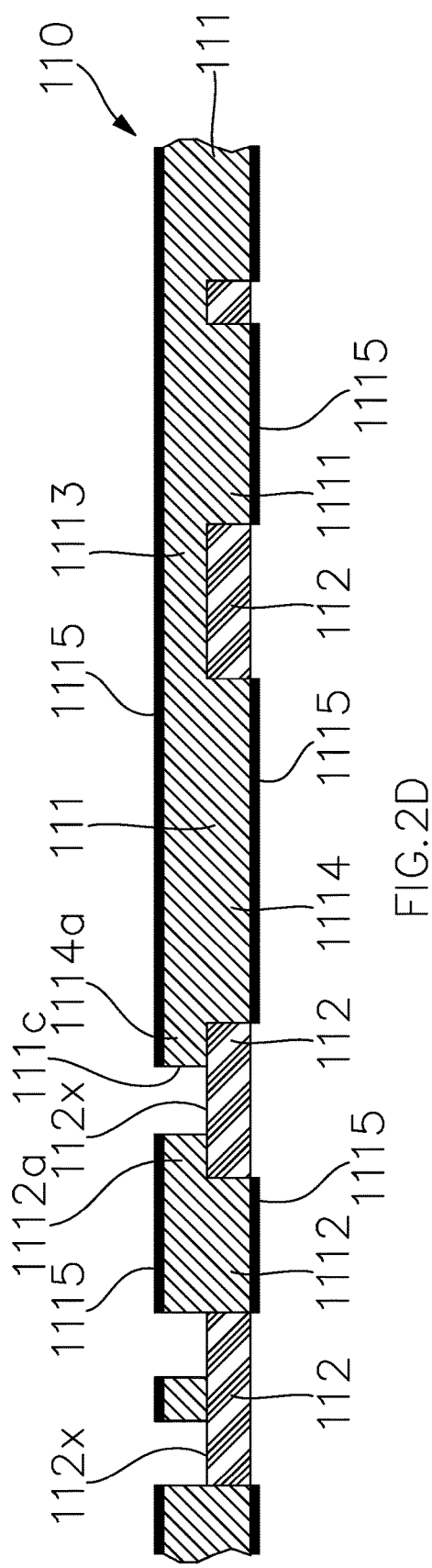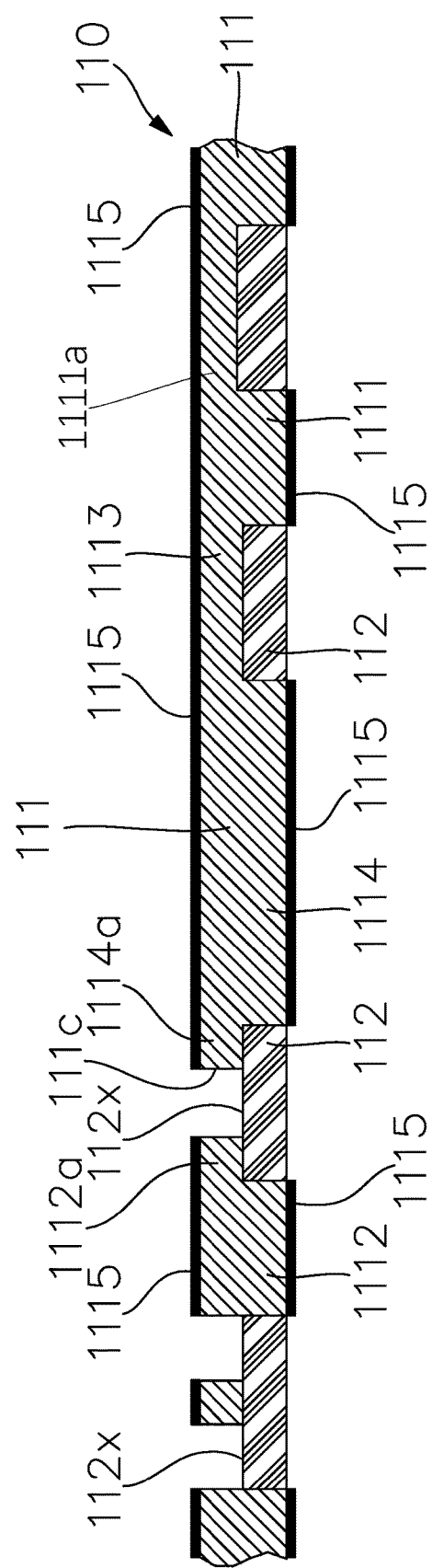

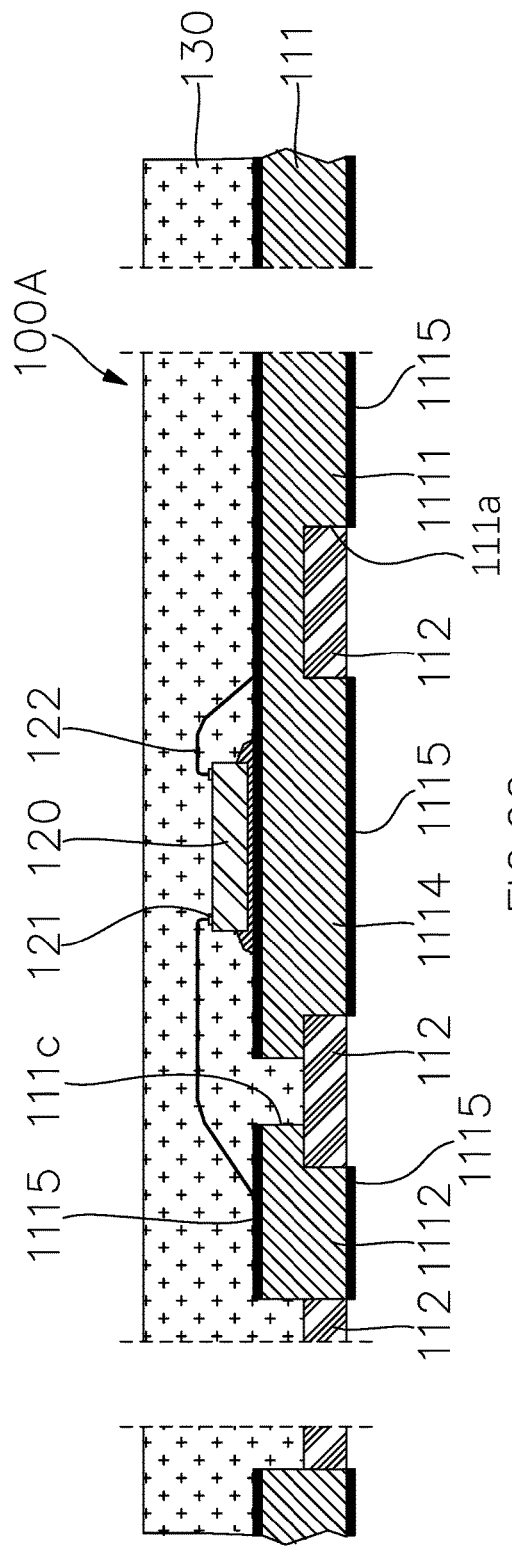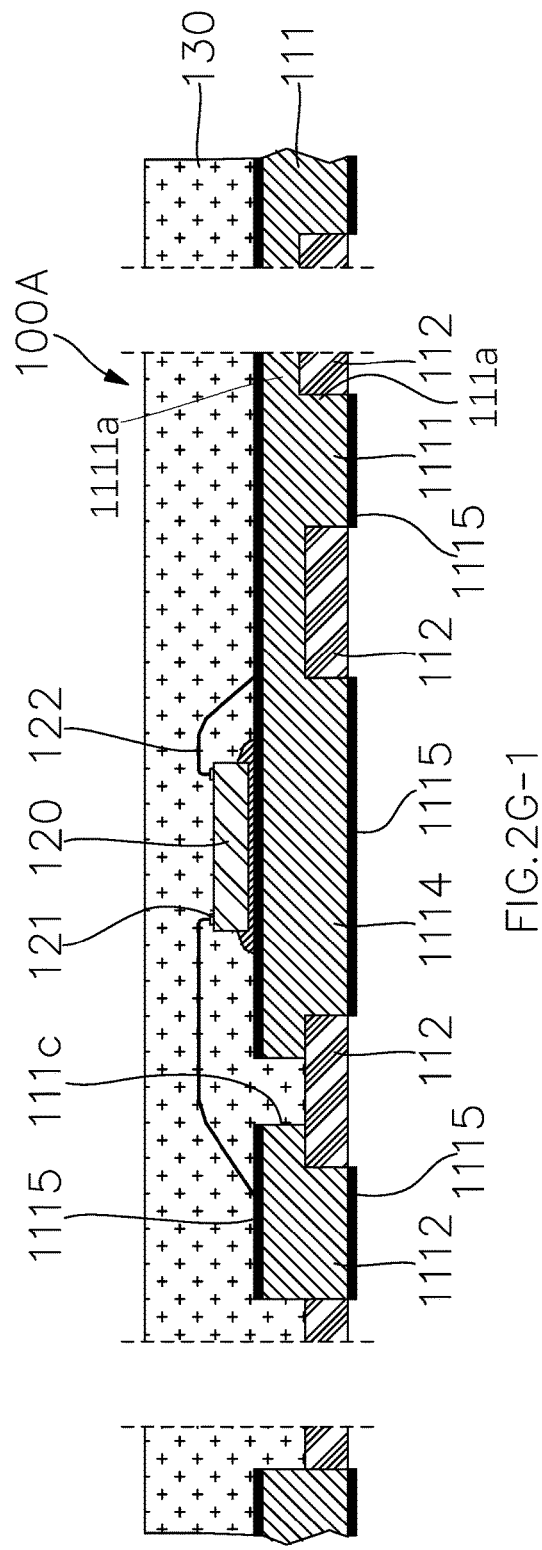

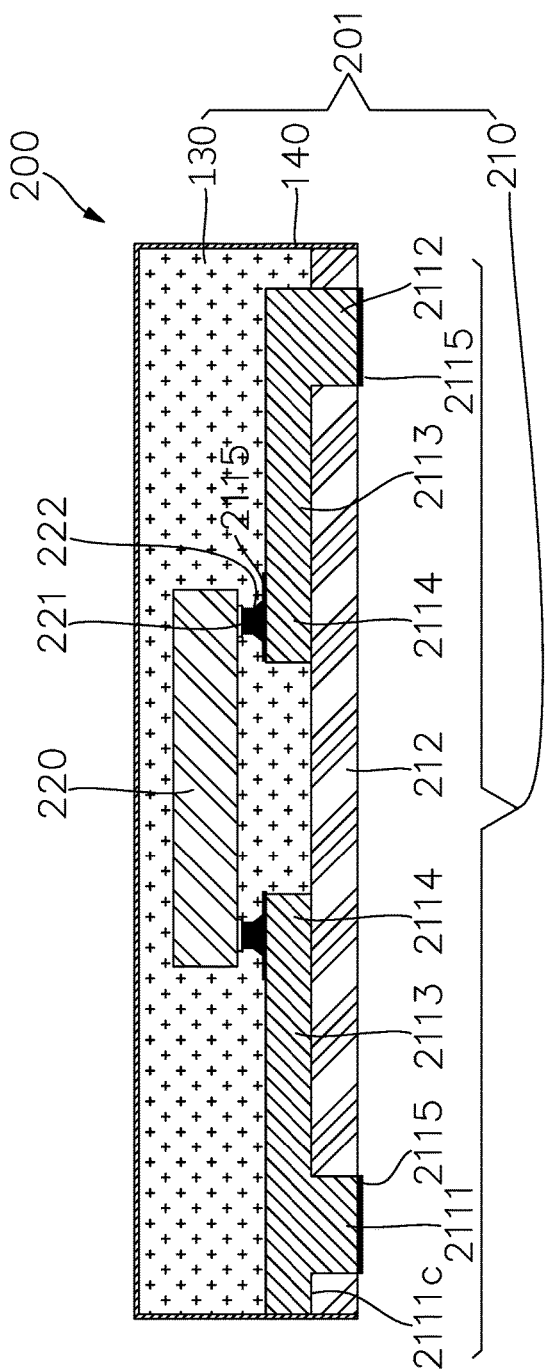
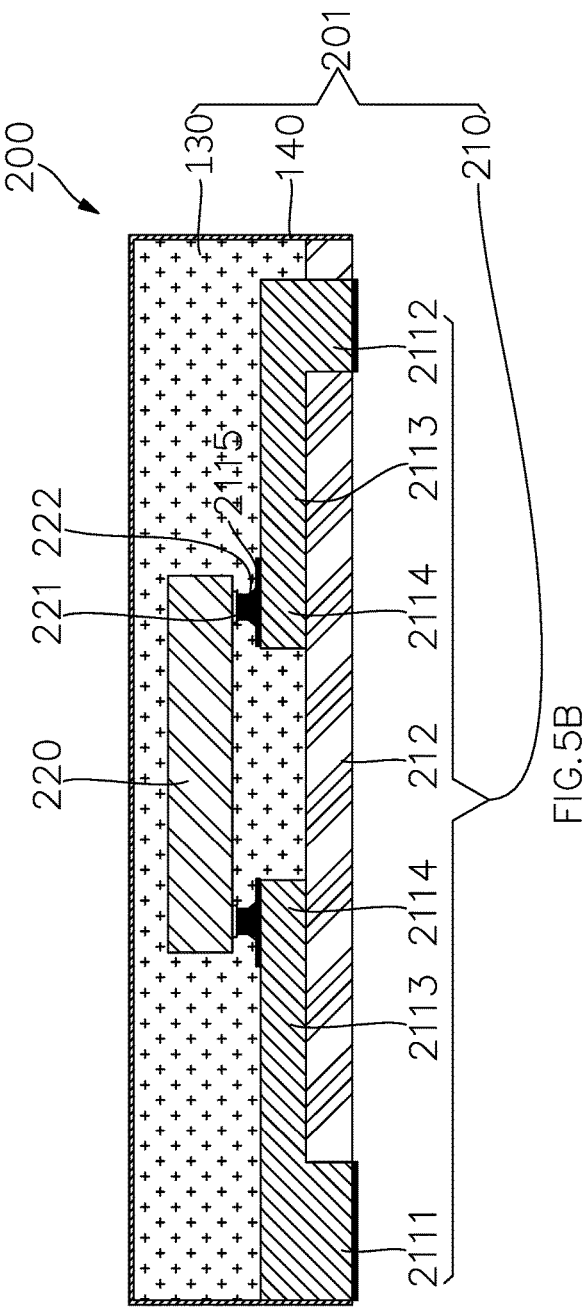
FIG.5A
FIG.5B

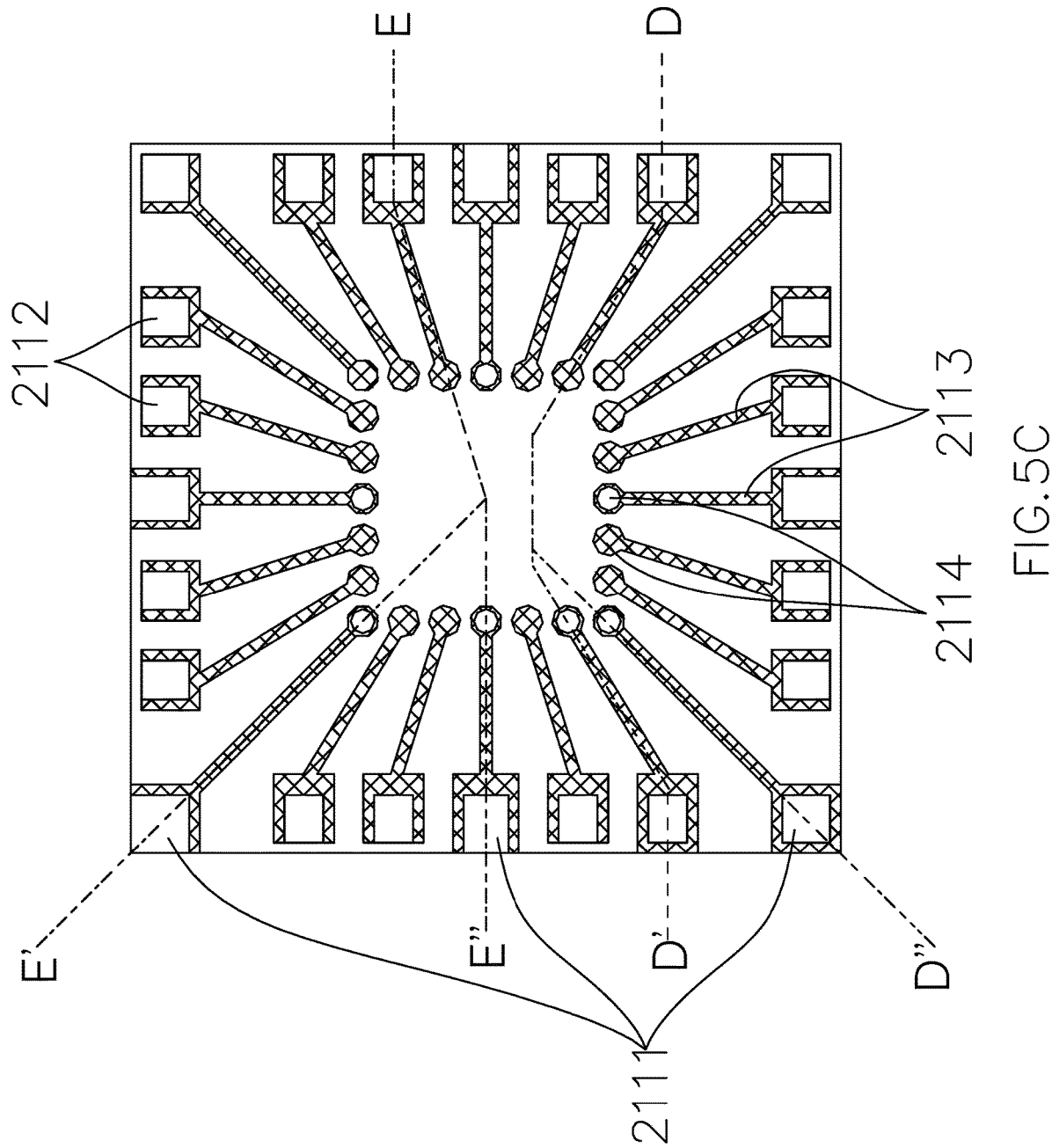

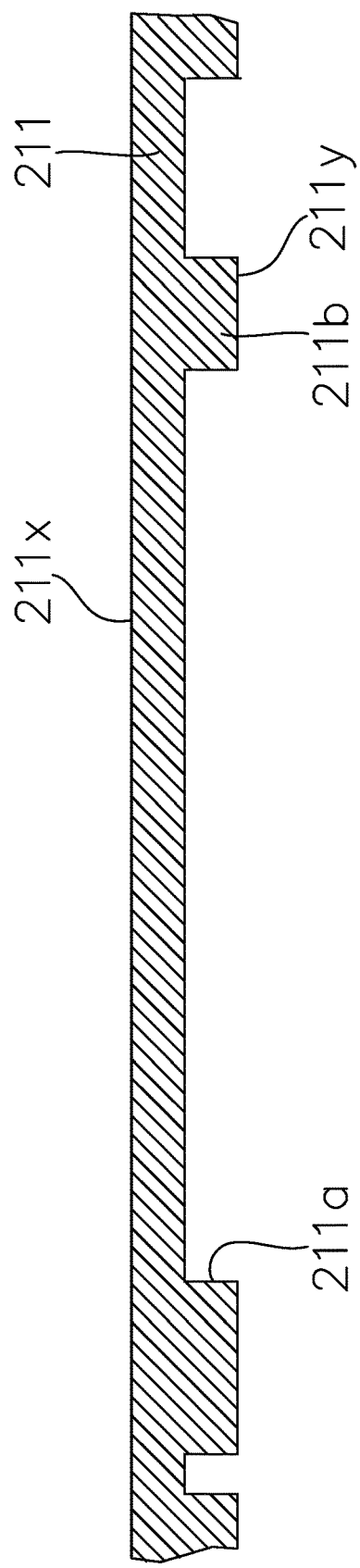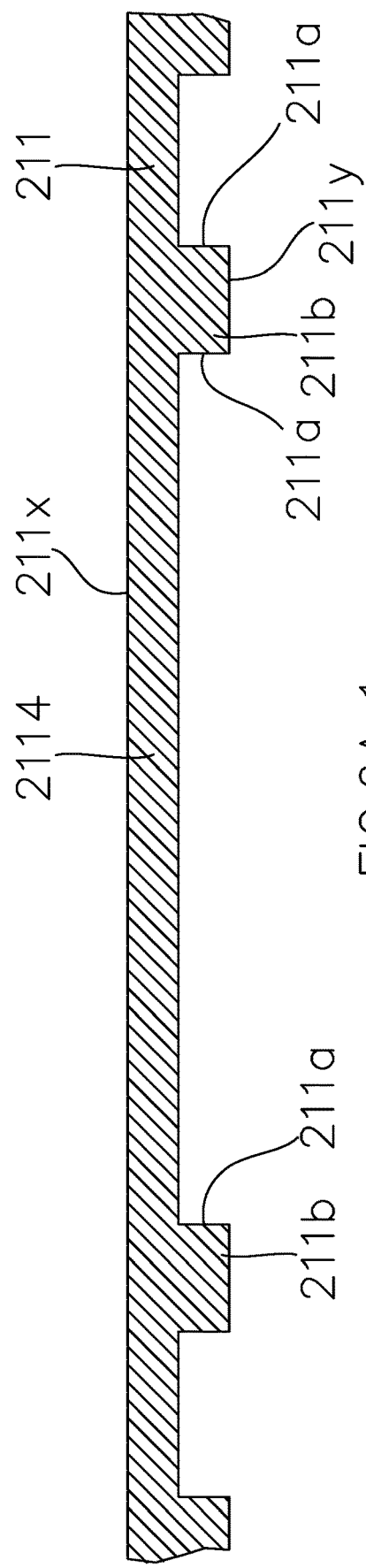

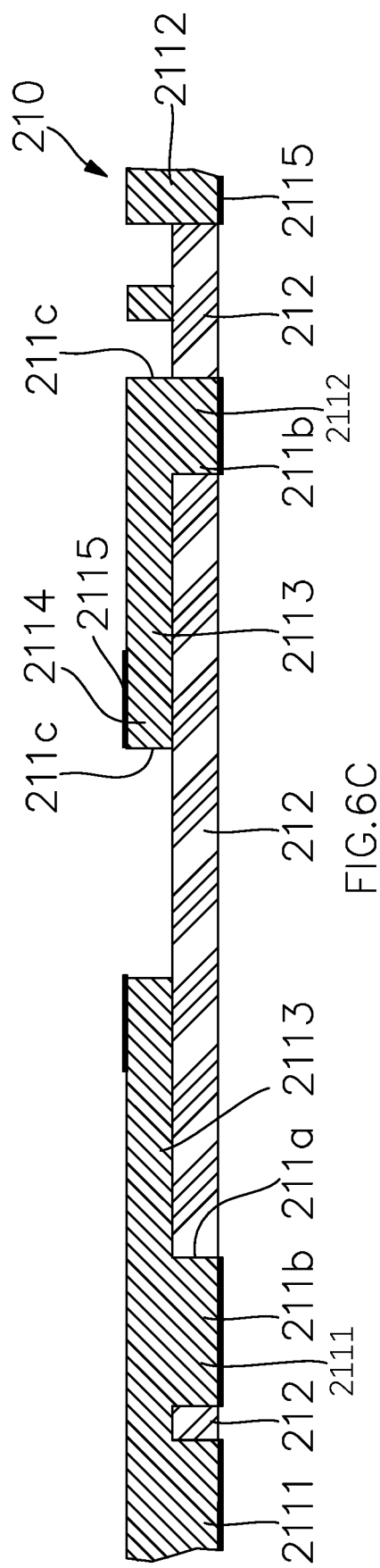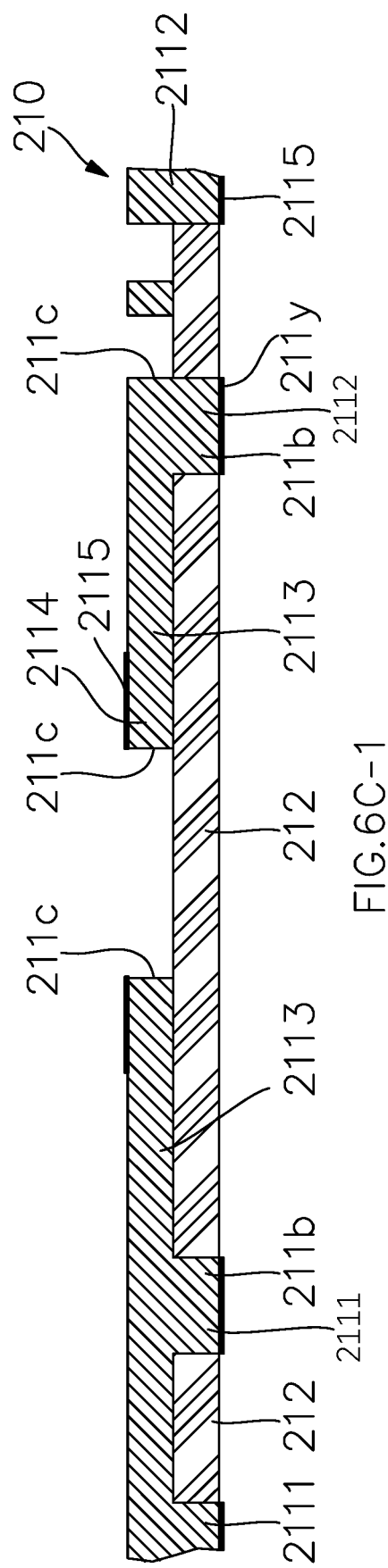

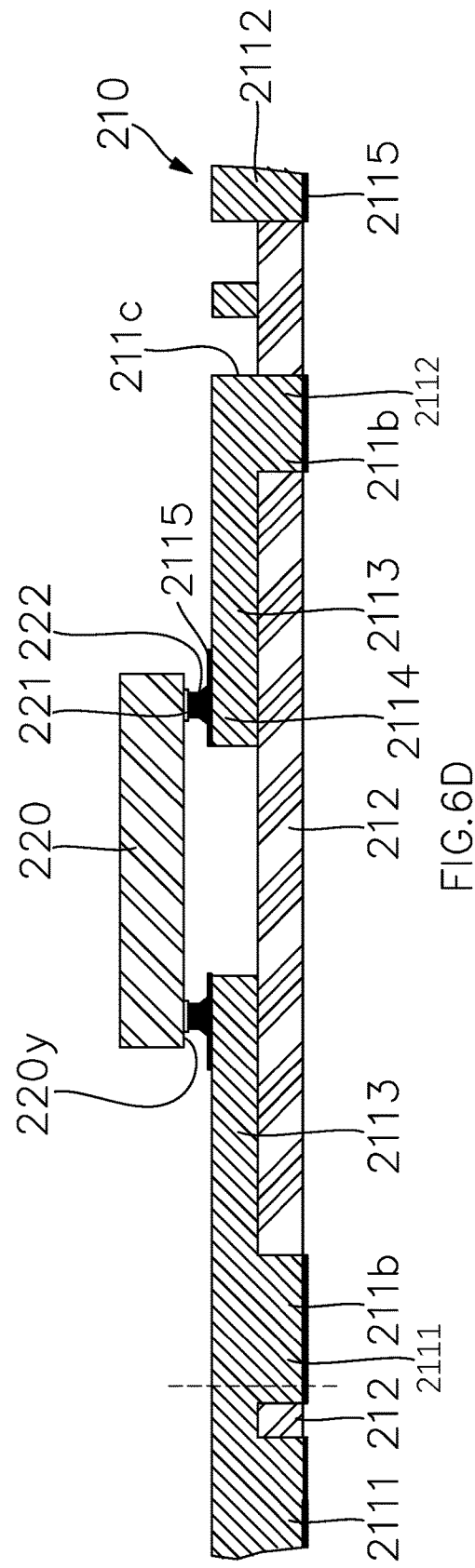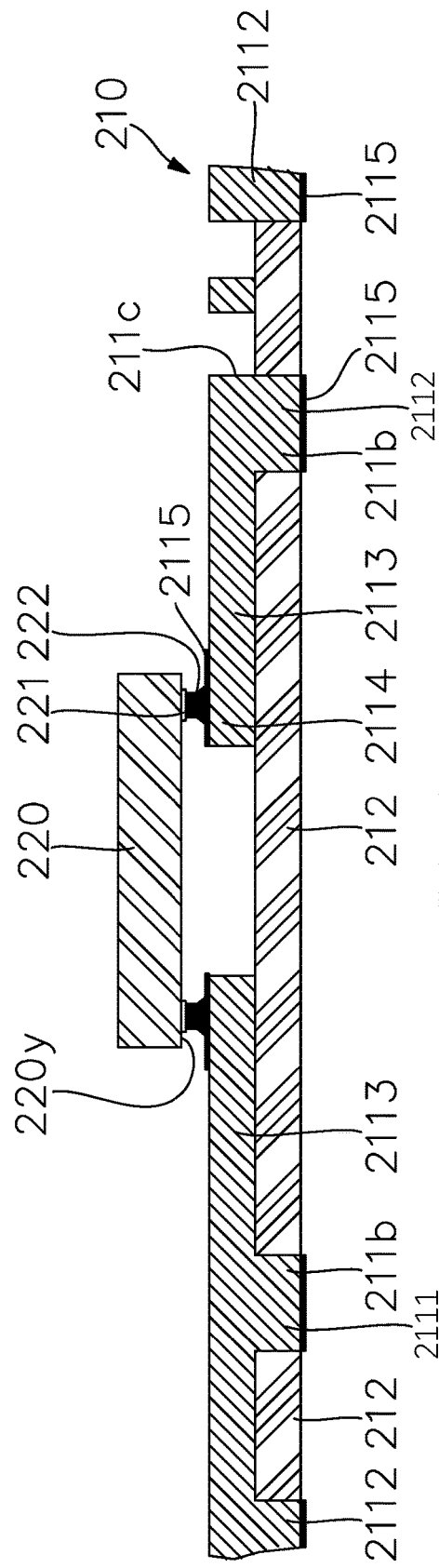

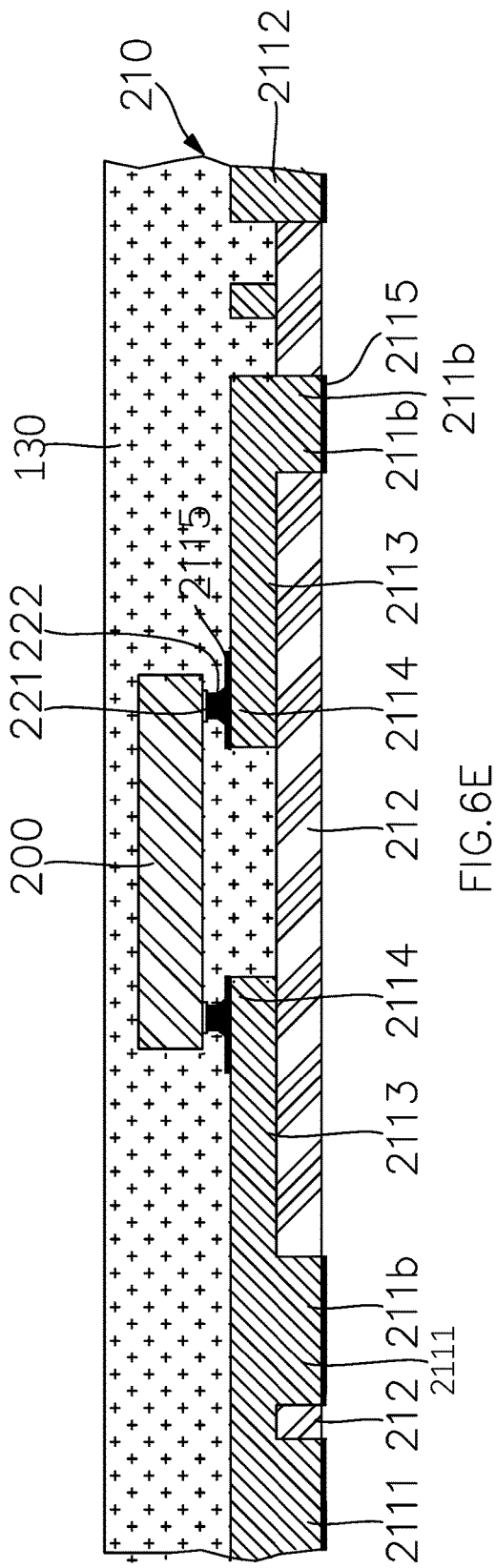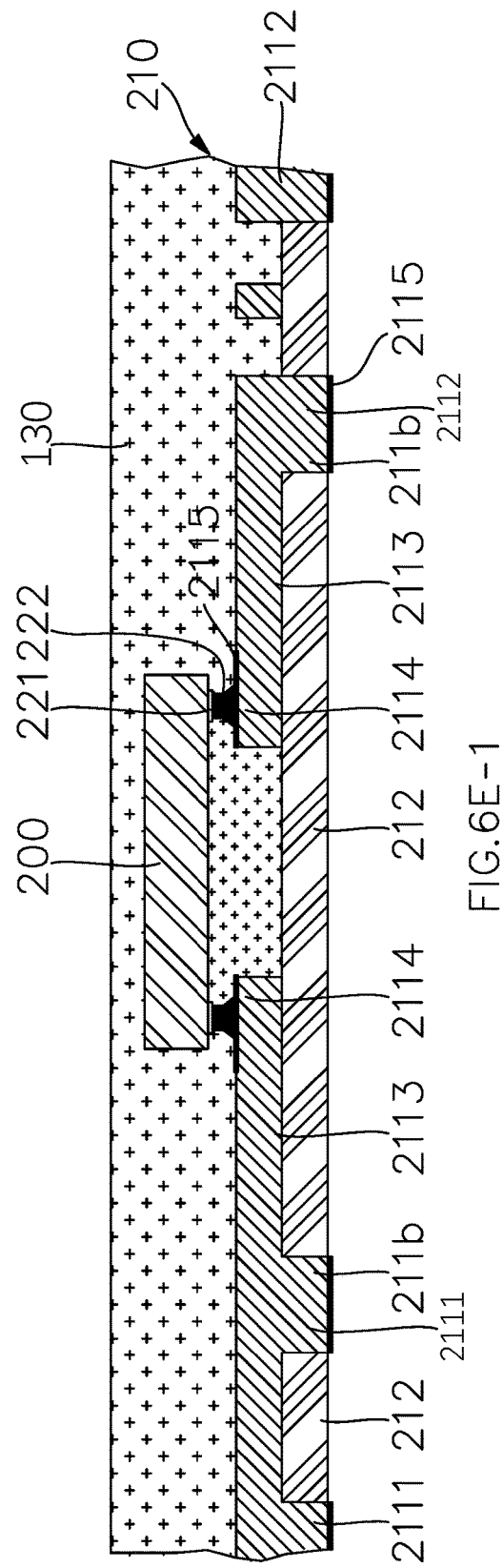

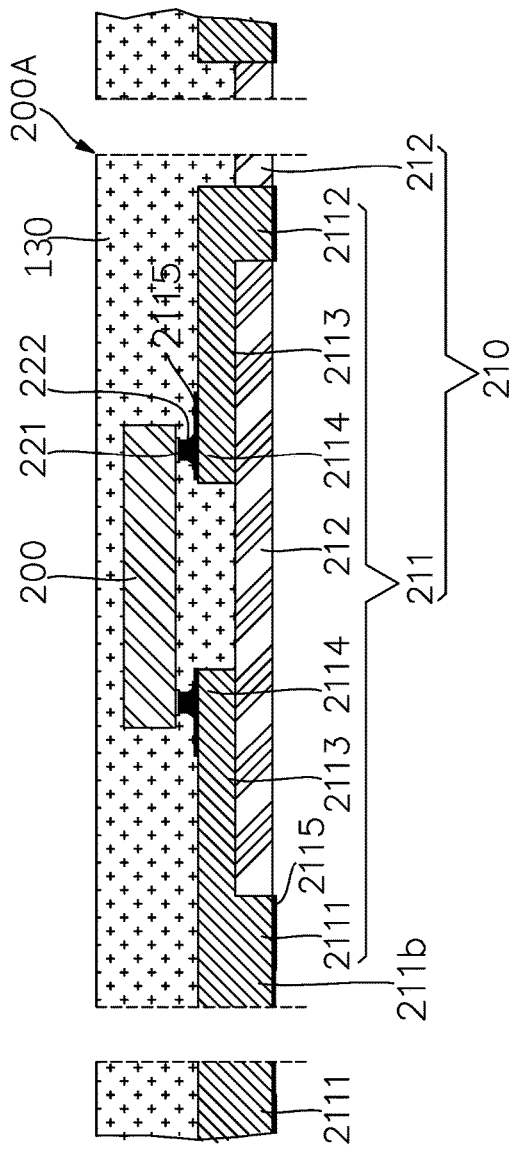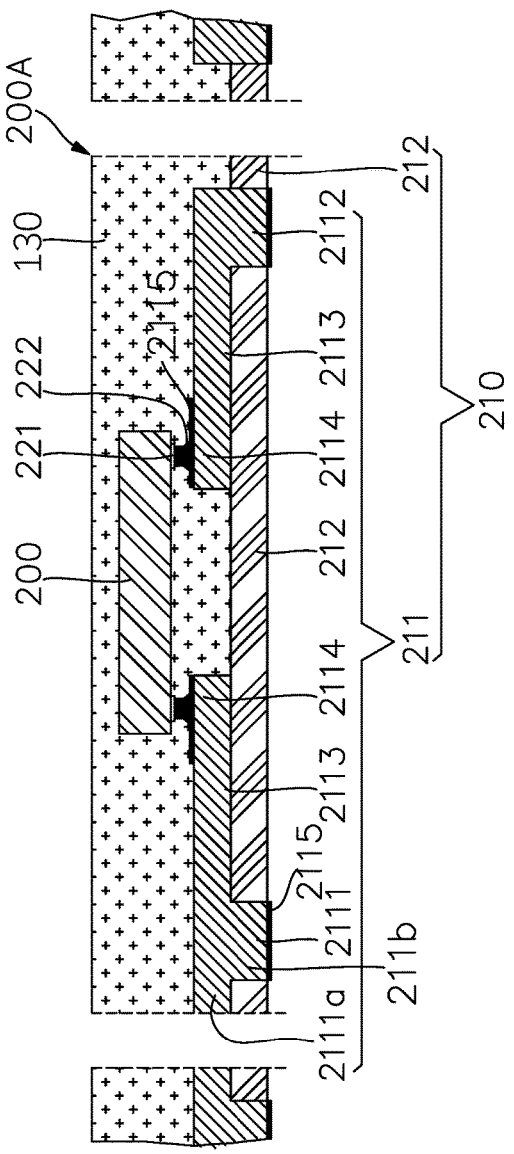

SEMICONDUCTOR DEVICES AND METHODS OF MANUFACTURING SEMICONDUCTOR DEVICES

CROSS-REFERENCE TO RELATED APPLICATIONS

Not applicable

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A, 1B, and 1C show cross-sectional views and a bottom view of an example semiconductor device.

FIGS. 2A, 2B, 2B-1, 2C, 2C-1, 2D, 2D-1, 2E, 2E-1, 2F, 2F-1, 2G, 2G-1, 2H, and 2H-1 show cross-sectional views of an example method for manufacturing an example semiconductor device.

FIGS. 5A, 5B, and 5C show cross-sectional views and a bottom view of an example semiconductor device.

FIGS. 6A, 6A-1, 6B, 6B-1, 6C, 6C-1, 6D, 6D-1, 6E, 6E-1, 6F, 6F-1, 6G, and 6G-1 show cross-sectional views of an example method for manufacturing an example semiconductor device.

Figure 1C:
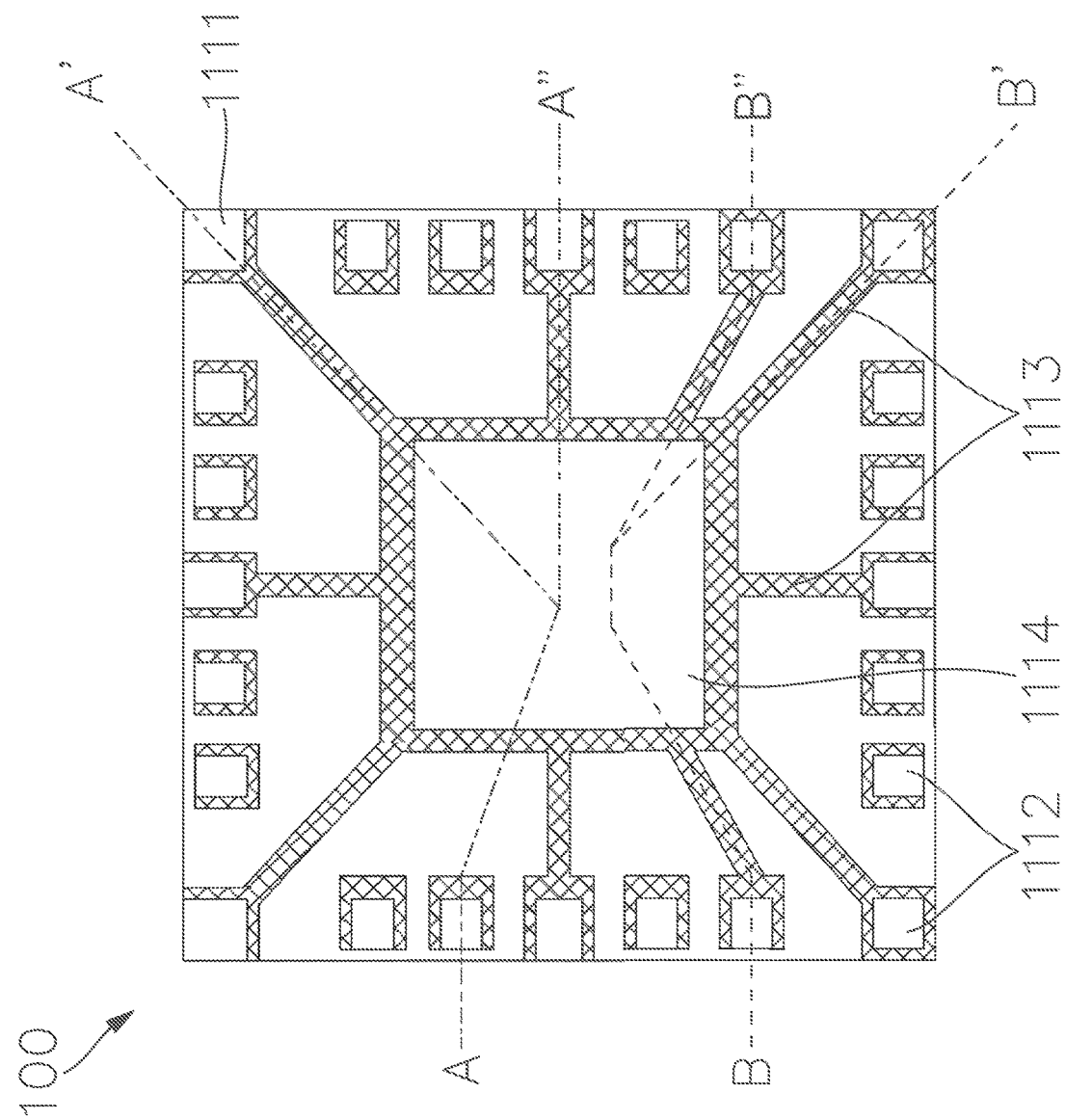

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques can be omitted to avoid unnecessarily obscuring the present disclosure. In addition, elements in the drawing figures are not necessarily drawn to scale. For example, the dimensions of some of the elements in the figures can be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. can be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" can be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" can be used to describe two elements directly contacting each other or describe two elements indirectly connected by one or more other elements.

DESCRIPTION

The present description includes, among other features, structures and associated methods that relate to electronic devices including, for example, semiconductor devices. In some examples, the electronic devices include pre-molded substrates with an edge lead having an outward side exposed from a substrate encapsulant. A body encapsulant covers the pre-molded substrate but not the outward side, and a conductive cover is over the body encapsulant and contacts the outward side of the edge lead. In some examples, the structures and methods can be used in sawn leadless packaging. In some examples, corner portions of the electronic devices can provide additional input/output capability and different leads can be selectively connected with the conductive cover to provide design flexibility. The structures and methods provide for, among other things, improved electromagnetic shielding.

In an example, a packaged electronic device includes a molded substrate. The molded substrate includes a conductive structure having an edge lead with an edge lead outward side and an edge lead inward side opposite to the edge lead outward side, and an inner lead having an inner lead outward side and an inner lead inward side opposite to the inner lead outward side. The molded substrate includes a substrate encapsulant covering a lower portion of the edge lead inward side, a lower portion of the inner lead inward side, and a lower portion of the inner lead outward side. An upper portion of the edge lead outward side and an upper portion of the inner lead outward side are exposed from the substrate encapsulant. An electronic component is connected to the edge lead and the inner lead. A body encapsulant covers the electronic component and portions of the conductive structure. The body encapsulant has a body encapsulant top side and body encapsulant sides, the upper portion of the edge lead outward side is exposed from one of the body encapsulant sides, and the body encapsulant covers the upper portion of the inner lead outward side and the upper portion of the inner lead inward side. A conductive cover is over the body encapsulant top side, the body encapsulant sides, and outer sides of the substrate encapsulant. The conductive cover contacts the upper portion of the edge lead outward side.

In an example, a packaged electronic device includes a pre-molded substrate. The pre-molded substrate has a conductive structure with an edge lead having an edge lead outward side, an edge lead inward side opposite to the edge lead outward side, an edge lead top side, and an edge lead bottom side opposite to the edge lead top side, and an inner lead having an inner lead outward side, an inner lead inward side opposite to the inner lead outward side, an inner lead top side, and an inner lead bottom side opposite to the inner lead top side. The pre-molded substrate includes a substrate encapsulant covering the conductive structure. An upper portion of the edge lead outward side and an upper portion of the inner lead outward side are exposed from the substrate encapsulant. A lower portion of the edge lead inward side, a lower portion of the inner lead inward side, and a lower portion of the inner lead outward side are covered by the substrate encapsulant. The edge lead top side, the edge lead bottom side, the inner lead top side, and the inner lead bottom side are exposed from the substrate encapsulant. An electronic component is connected to the pre-molded substrate, and a body encapsulant covers the electronic component and portions of the conductive structure. The body encapsulant has a body encapsulant top side and body encapsulant sides, the upper portion of the edge lead outward side is exposed from one of the body encapsulant sides, and the body encapsulant covers the upper portion of the inner lead outward side, the upper portion of the inner lead inward side, the inner lead top side, and the edge lead top side. A conductive cover is over the body encapsulant top side, the body encapsulant sides, and outer sides of the substrate encapsulant. The conductive cover contacts the upper portion of the edge lead outward side.

In an example, a method for manufacturing a packaged electronic device includes providing a molded substrate. The molded substrate includes a conductive structure having an edge lead with an edge lead outward side and an edge lead inward side opposite to the edge lead outward side, and an inner lead having an inner lead outward side and an inner lead inward side opposite to the inner lead outward side. The molded substrate includes a substrate encapsulant covering a lower portion of the edge lead inward side, a lower portion of the inner lead inward side, and a lower portion of the inner lead outward side. An upper portion of the edge lead outward side and an upper portion of the inner lead outward side are exposed from the substrate encapsulant. The method includes connecting an electronic component to the edge lead and the inner lead. The method includes providing body encapsulant covering the electronic component and portions of the conductive structure. The body encapsulant has a body encapsulant top side and body encapsulant sides, the upper portion of the edge lead outward side is exposed from one of the body encapsulant sides, and the body encapsulant covers the upper portion of the inner lead outward side and the upper portion of the inner lead inward side. The method includes providing a conductive cover over the body encapsulant top side, the body encapsulant sides, and outer sides of the substrate encapsulant. The conductive cover contacts the upper portion of the edge lead outward side.

Other examples are included in the present disclosure. Such examples can be found in the figures, in the claims, and/or in the description of the present disclosure.

FIGS. 1A, 1B and 1C show cross-sectional views and a bottom "X-Ray" view of an example electronic device 100. FIG. 1A is a cross-sectional view taken along either of lines A-A' or A-A" in FIG. 1C. FIG. 1B is a cross-sectional view taken along either of lines B-B' or B-B" in FIG. 1C.

In the example shown in FIGS. 1A to 1C, semiconductor device 100 can comprise substrate 110, electronic component 120, body encapsulant 130, and conductive cover 140. Substrate 110 can comprise conductive structure 111 and dielectric structure 112. Conductive structure 111 can comprise edge lead 1111, inner lead 1112, trace 1113, and paddle 1114. In the bottom "X-Ray" view of FIG. 1C, portions where conductive structure 111 is covered by dielectric structure 112 are illustrated as a hatch pattern. Electronic component 120 can comprise component terminals 121 and component interconnects 122.

Substrate 110, body encapsulant 130, and conductive cover 140 can comprise or be referred to as semiconductor package 101 or package 101, semiconductor package 101 can protect the electronic component 120 from exposure to external elements and/or environments. Semiconductor package 101 can provide an electrical coupling between an external component and electronic component 120.

FIGS. 2A 2B, 2B-1, 2C, 2C-1, 2D, 2D-1, 2E, 2E-1, 2F, 2F-1, 2G, 2G-1, 2H, and 2H-1 show cross-sectional views of an example method for manufacturing example semiconductor device 100. FIGS. 2A, 2B, 2C, 2D, 2E, 2F, 2G, and 2H are cross-sectional views showing a manufacturing method of a cross section taken along either of lines A-A' or A-A" of semiconductor device 100 shown in FIGS. 1A and 1C. FIGS. 2A, 2B-1, 2C-1, 2D-1, 2E-1, 2F-1, 2G-1 and 2H-1 are cross-sectional views showing a manufacturing method of a cross section taken along either of lines B-B' or B-B" of the semiconductor device 100 shown in FIGS. 1B and 1C.

FIG. 2A shows a cross-sectional view of electronic device 100 at an early stage of manufacture.

In the example shown in FIG. 2A, conductive structure 111 can be substantially a planar plate. In some examples, conductive structure 111 can comprise or be referred to as a leadframe, a conductor, a conductive material, or a conductive layer. In some examples, conductive structure 111 can be formed of a material such as copper (Cu) or a copper alloy (Cu including one or more of nickel (Ni), silicon (Si), phosphorous (P), or titanium (Ti), an iron-nickel alloy, or a Cu/Steel/Cu clad metal. In some examples, conductive structure 111 can comprise a plating layer such as tin (Sn), nickel (Ni), palladium (Pd), gold (Au), or silver (Ag) plated to prevent oxidation. In some examples, the thickness of conductive structure 111 can range from approximately 7.62 µm (micrometers) to 22.86 µm.

Figure 2E:
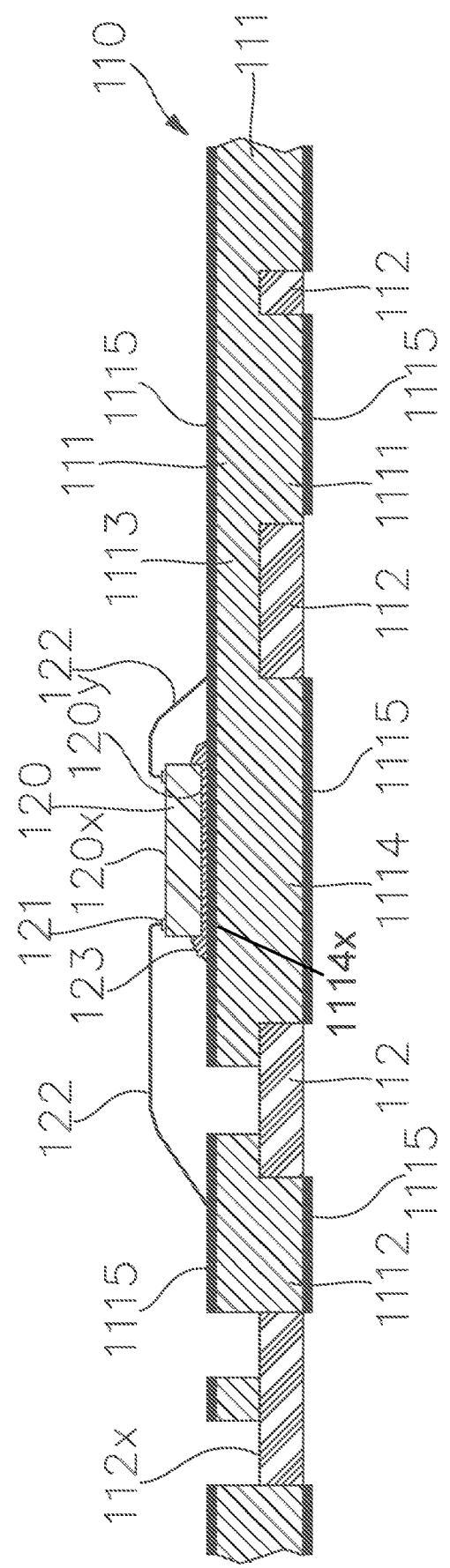
Figures 1, 2E:
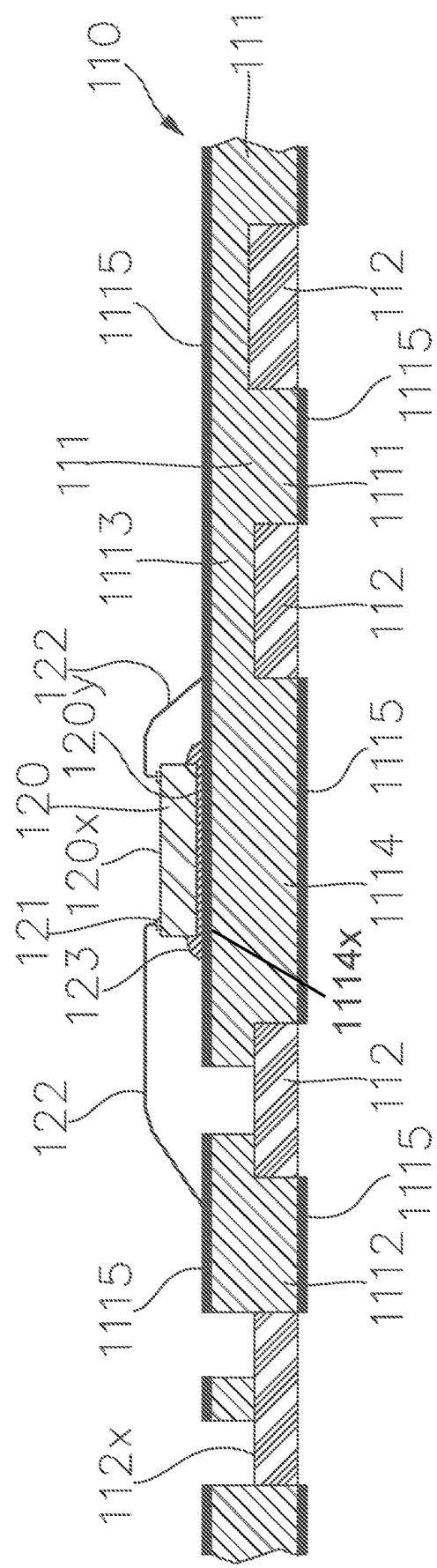
Figure 3A:
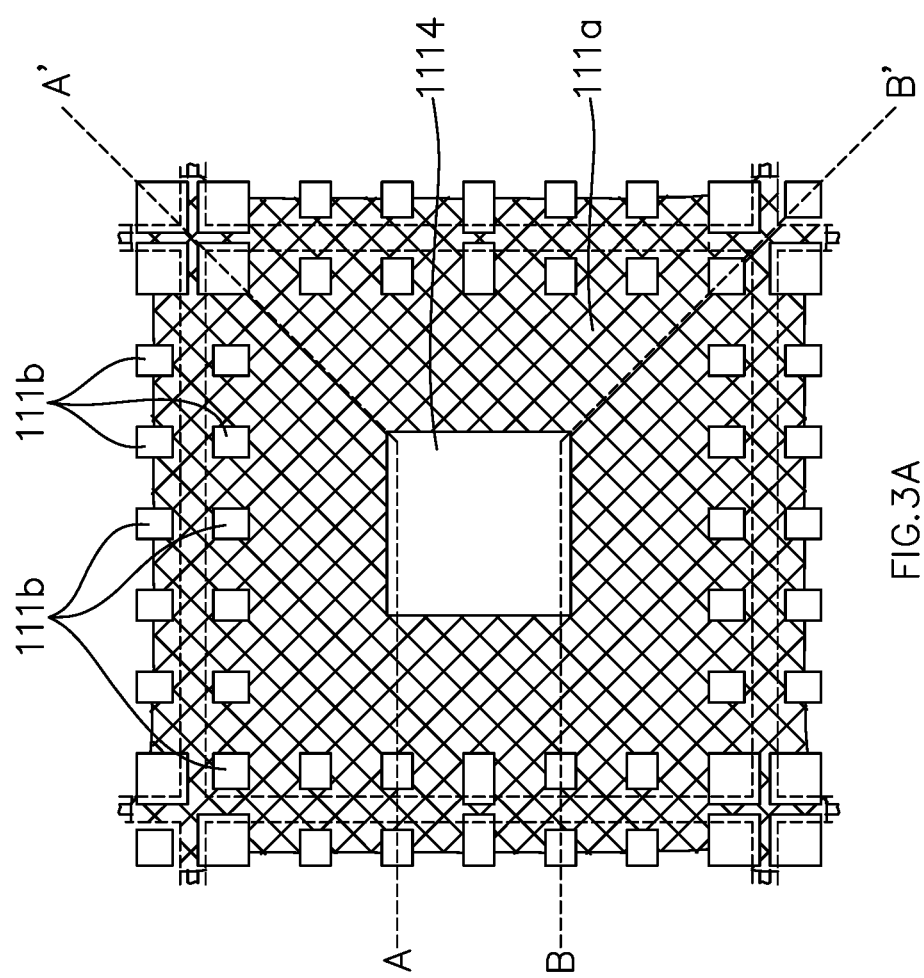
FIG. 3A shows a bottom view of an example semiconductor device.

FIGS. 2B, 2B-1 show cross-sectional views, and FIG. 3A shows bottom view, of semiconductor device 100 at a later stage of manufacture. FIG. 2B is taken along reference line A-A' of FIG. 3A, and FIG. 2B-1 is taken along line B-B' of FIG. 3A.

In the example shown in FIGS. 2B, 2B-1 and 3A, portions of the plate of conductive structure 111 can be removed from lower side 111y to a predetermined depth to form cavity 111a. FIG. 3A shows a region where cavity 111a is formed in conductive structure 111 as a hatch. Upper side 111x of conductive structure 111 can maintain a flat shape. Conductive structure 111 can be provided with leads 111b and paddle 1114 protruding downward and defined by cavity 111a. In some examples, after forming a mask pattern on lower side 111y of conductive structure 111, cavity 111a can be formed by removing exposed conductive structure 111 to a predetermined depth through etching. For example, the mask pattern can use a photoresist. In some examples, cavity 111a can be provided between leads 111b, and between leads 111b and paddle 1114. In some examples, cavity 111a can be provided between leads 111b arranged in a square ring shape to be spaced apart from each other. Cavity 111a can be provided between the central portion of conductive structure 111 where paddle 1114 is positioned and leads 111b. In some examples, cavity 111a can also be provided between leads 111b and the edge. In some examples, leads 111b can comprise or be referred to as a conductor, a conductive material, a conductive land, a conductive pad, a wiring pad, a ground lead, a signal lead, a terminal lead, or a connection pad. In some examples cavity 111a, or the height of leads 111b or paddle 1114 defined by cavity 111a, can be approximately half the thickness of conductive structure 111, or can range from 3.8 μm to 12.5 μm.

FIGS. 2C and 2C-1 show cross-sectional views of semiconductor device 100 at a later stage of manufacture.

In the example shown in FIGS. 2C and 2C-1, dielectric structure 112 can be filled in cavity 111a of conductive structure 111. In some examples, lower side 112y of dielectric structure 112 can be coplanar with lower side 111y of conductive structure 111. In some examples, dielectric structure 112 can be provided between leads 111b and between leads 111b and paddle 1114. In some examples, dielectric structure 112 can be provided between leads 111b arranged in a square ring shape to be spaced apart from each other. The dielectric structure 112 can be provided between the central portion of the conductive structure 111 where the paddle 1114 is positioned and leads 111b. In some examples, dielectric structure 112 can also be provided between leads 111b and the edges. In some examples, dielectric structure 112 can comprise or be referred to as a premold resin structure, a substrate encapsulant, a lower encapsulant, a dielectric material, a dielectric layer, an insulating layer, or a protective layer. In some examples, dielectric structure 112 can be made of an insulating material such as a mold compound, a polymer, or a resin with filler. In some examples, dielectric structure 112 can be formed in any of a variety of ways. For example, dielectric structure 112 can be formed by compression molding, transfer molding, liquid encapsulant molding, vacuum lamination, paste printing, screen printing, or film assist molding. The thickness of dielectric structure 112 can be smaller than the height of conductive structure 111. The thickness of dielectric structure 112 can be equal to or greater than half the thickness of conductive structure 111.

Figure 4A:
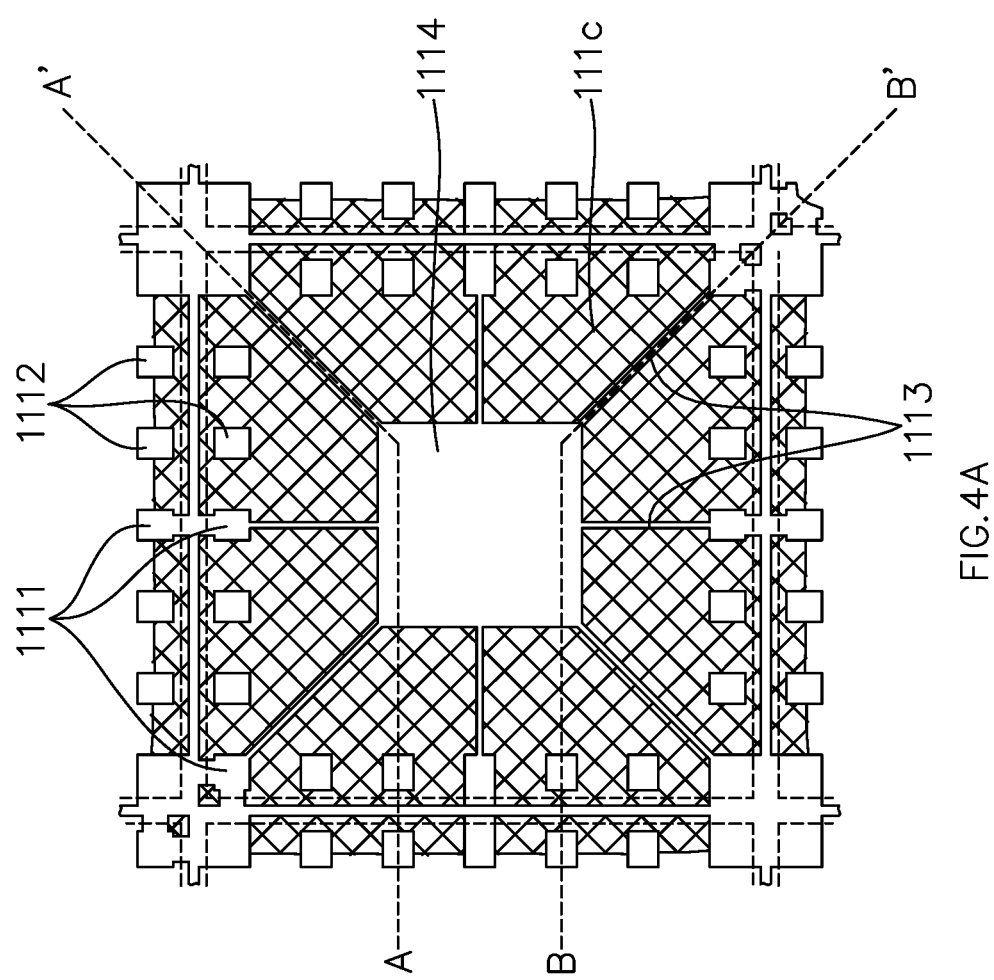
FIG. 4A shows a top view of an example semiconductor device.

FIGS. 2D, 2D-1 show cross-sectional views, and FIG. 4A shows a top view, of semiconductor device 100 at a later stage of manufacture. FIG. 2D is taken along reference line A-A' of FIG. 4A and FIG. 2D-1 is taken along reference line B-B' of FIG. 4A.

In the example shown in FIGS. 2D, 2D-1 and 4A, cavity 111c can be formed by portions of conductive structure 111 downward from upper side 111x to a predetermined depth. FIG. 4A shows a region where cavity 111c is formed in conductive structure 111 as a hatch. By means of cavity 111c, conductive structure 111 can be defined with leads 111b and paddle 1114 separated from each other, and with leads 111b separated from each other. In some examples, paddle 1114 can be a full thickness or a partial thickness of conductive structure 111. In some examples, a method for manufacturing cavity 111c can be similar to a method for manufacturing cavity 111a. In some examples, cavity 111c can separate leads 111b arranged in a square ring shape, respectively. In some examples, cavity 111c can separate leads 111b and paddle 1114 from each other. In some examples, at least one lead 111b can be connected to paddle 1114 and trace 1113. Leads 111b can comprise edge lead 1111 and inner lead 1112, and edge lead 1111 can be connected to paddle 1114 through trace 1113. In some examples, edge lead 1111 can comprise or be referred to as a shield lead, an exposed lead, or a ground lead. In some examples, inner lead 1112 can comprise or be referred to as a terminal lead, an internal lead, a covered lead, or a signal lead. In some examples, edge lead 1111 and inner lead 1112 can comprise or be referred to or defined as a full thickness region.

In some examples, lower side of trace 1113 can be in contact with an upper side of dielectric structure 112. Trace 1113 can be thinner than the thickness of conductive structure 111. In some examples, trace 1113 can comprise or be referred to as a partial-thickness, a partial-etched or a half-etched part or portion of conductive structure 111. In some examples, the height of trace 1113 can be less than or equal to half the thickness of conductive structure 111, or can range from 3.8 μm to 12.5 μm.

In some examples, cavity 111c can be provided between leads 111b, and between leads 111b and paddle 1114. In some examples, cavity 111c can also be provided between leads 111b and edges of conductive structure 111. Upper side 112x of dielectric structure 112 can be exposed from the upper portion of conductive structure 111 by cavity 111c.

In some examples, edge lead 1111 or inner lead 1112 can comprise edge lead lip 1111a or inner lead lip 1112a provided on the upper side of dielectric structure 112. Lower sides of edge lead lip 1111a and inner lead lip 1112a can be in contact with upper side 112x of dielectric structure 112. In some examples, edge lead lip 1111a or inner lead lip 1112a can have the similar height as trace 1113. In some examples, edge lead lip 1111a and inner lead lip 1112a can comprise or be referred to as partial-thickness, partial-etched, or half-etched parts or portions of conductive structure 111. In some examples, paddle 1114 can comprise pad lip 1114a provided on the upper side of dielectric structure 112. In some examples, the height of pad lip 1114a can be similar to trace 1113.

In some examples, a conductive coating 1115 can be provided on top, bottom or lateral sides of edge lead 1111, inner lead 1112, or paddle 1114 to prevent oxidation and facilitate conductive connection, respectively. In some examples, conductive coating 1115 can be provided to cover portions of the upper and lower sides of edge lead 1111, inner lead 1112, or paddle 1114, respectively. Conductive coating 1115 can be connected to edge lead 1111, inner lead 1112, and paddle 1114, respectively. In some examples, conductive coating 1115 can be provided on the upper side of trace 1113. In some examples, conductive coating 1115 can be formed by electroless plating, electrolytic plating, sputtering, physical vapor deposition (PVD), chemical vapor deposition (CVD), metal organic CVD (MOCVD), atomic layer deposition (ALD), low pressure CVD (LPCVD), or plasma-enhanced CVD (PECVD). In some examples, conductive coating 1115 can comprise PPF (Ni/Pd/Au (or silver alloy)). In some examples, the thickness of the conductive coating 1115 can range from approximately 1.54 μm to 7.62 μm.

In some examples, conductive coating 1115 can comprise Ag or Sn. When conductive coating 1115 comprises Ag, Ag can be provided to cover only a portion of the upper side of edge lead 1111, inner lead 1112, paddle 1114, such as where electronic component 120 or component interconnect 122 would attach. When conductive coating 1115 comprises Sn, Sn can be provided to cover the lower sides of edge lead 1111, inner lead 1112, or paddle 1114. In some examples, conductive coating 1115 made of Sn can be provided after electronic component 120 is provided, after body encapsulant 130 is provided, or after conductive cover 140 is provided. In some examples, the thickness of Ag of the conductive coating 1115 provided on the upper side of the edge lead 1111, inner lead 1112, or paddle 1114 can range from approximately 1.5 µm to 7.7 µm. In some examples, the thickness of conductive coating 1115 made of Sn provided on the lower side of edge lead 1111, inner lead 1112, or paddle 1114 can range from 7.7 µm to 23.0 µm.

Completed substrate 110 can comprise conductive structure 111 and dielectric structure 112. Conductive structure 111 can comprise edge lead 1111, inner lead 1112, trace 1113, and paddle 1114. In some examples, conductive structure 111 can comprise conductive coating 1115. In some examples, substrate 110 can comprise or be referred to as a molded substrate, a pre-molded substrate, a molded leadframe or a routable molded leadframe. In some examples, substrate 110 is other than a printed circuit board (PCB) substrate.

FIGS. 2E and 2E-1 show semiconductor device 100 at a later stage of manufacture. In the example shown in FIGS. 2E and 2E-1, lower side 120y of electronic component 120 can be attached to the upper side of substrate 110 by component adhesive 123. In some examples, after applying or attaching component adhesive 123 to upper side 1114x of paddle 1114 of conductive structure 111 of substrate 110, pick-and-place equipment picks up electronic component 120 and places it on component adhesive 123, thereby adhering electronic component 120 to substrate 110. Electronic component 120 can comprise or be referred to as a semiconductor die, a semiconductor chip, or a semiconductor package. The overall thickness of electronic component 120 can range from approximately 50 µm to 500 µm in some examples.

Electronic component 120 can comprise an active region a non-active region. In some examples, in electronic component 120, the active region can be provided on the upper side of substrate 110, and the non-active region can be adhered to substrate 110. Also, the active region can comprise one or more component terminals 121. In some examples, electronic component 120 can comprise an active component or a passive component.

Component terminals 121 can be in a row and/or column arrangement along upper side 120x of the electronic component 120. In some examples, component terminal 121 can comprise or be referred to as a die pad, a bump, or a bond pad. In some examples, component terminal 121 can comprise a metallic material, aluminum (Al), Cu, an Al alloy, or Cu alloy. Component terminal 121 can be an input/output terminal, or a power terminal of electronic component 120. The thickness of component terminal 121 can range from about 5 µm to about 20 µm in some examples.

Component adhesive 123 can adhere lower side 120y of electronic component 120 to upper side 1114x of paddle 1114. Component adhesive 123 can be interposed between lower side 120y of electronic component 120 and upper side 1114x of paddle 1114. In some examples, component adhesive 123 is coated on upper side 1114x of paddle 1114 by: a coating method such as spin coating, doctor blade, casting, painting, spray coating, slot die coating, curtain coating, slide coating, or knife over edge coating; a printing method such as screen printing, pad printing, gravure printing, flexographic printing or offset printing; an inkjet printing, a technology intermediate between coating and printing; or direct attachment of an adhesive film or adhesive tape. In some examples, component adhesive 123 can comprise or be referred to as an adhesive layer or an adhesive film. The thickness of component adhesive 123 can range from 5 µm to 60 µm. Component adhesive 123 can comprise a thermally conductive and electrically insulating material or a thermally conductive and electrically conductive material.

Component interconnect 122 can connect component terminal 121 of electronic component 120 and substrate 110. Component interconnect 122 can connect component terminal 121 and inner lead 1112 of electronic component 120 and component terminal 121 and paddle 1114, respectively. In some examples, component interconnect 122 can connect component terminal 121 and edge lead 1111.

In some examples, component interconnect 122 can comprise or referred to as a conductive wire or a bonding wire. In some examples, component interconnect 122 can comprise Au, Al, or Cu. In some examples, component interconnect 122 can be bonded to component terminal 121 by wire bonding equipment in the form of a wire, and can then be bonded to edge lead 1111, inner lead 1112, or paddle 1114 of substrate 110, thereby connecting substrate 110 and electronic component 120. The thickness of component interconnect 122 can range from approximately 15 µm to 30 µm in some examples.

Although electronic component 120 is shown coupled to substrate 110 in a face-up and wirebonded configuration with wires, there can be examples where electronic component 120 can be coupled to substrate 110 in a face-down or flip-chip configuration with bumps.

Figure 2F:
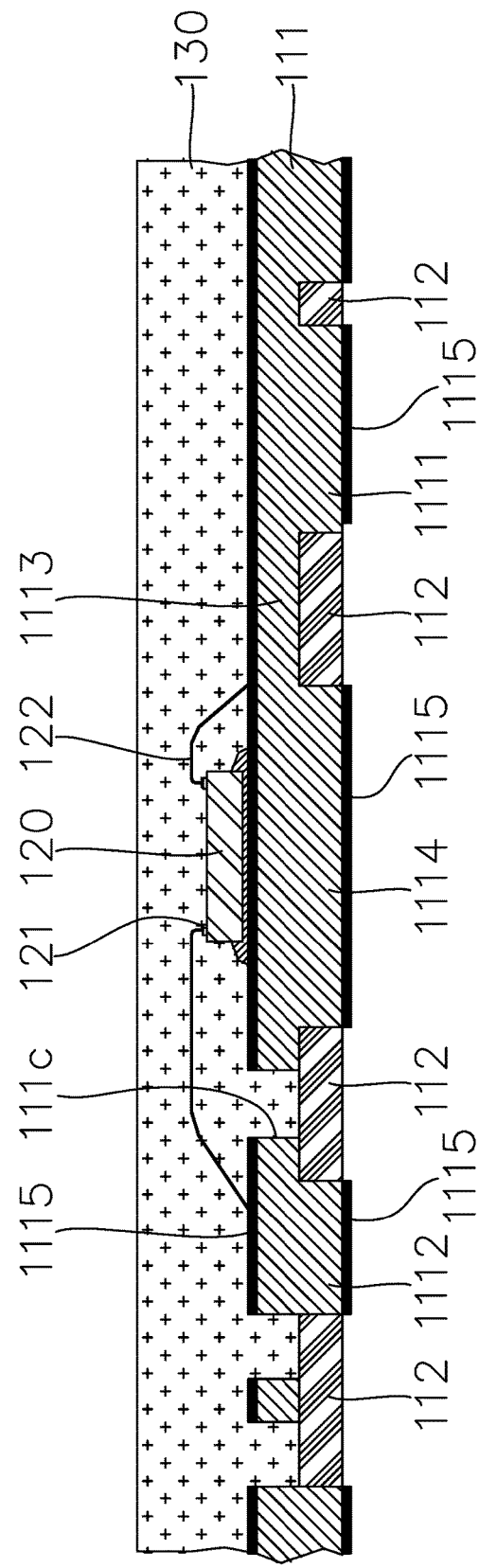
Figures 1, 2F:
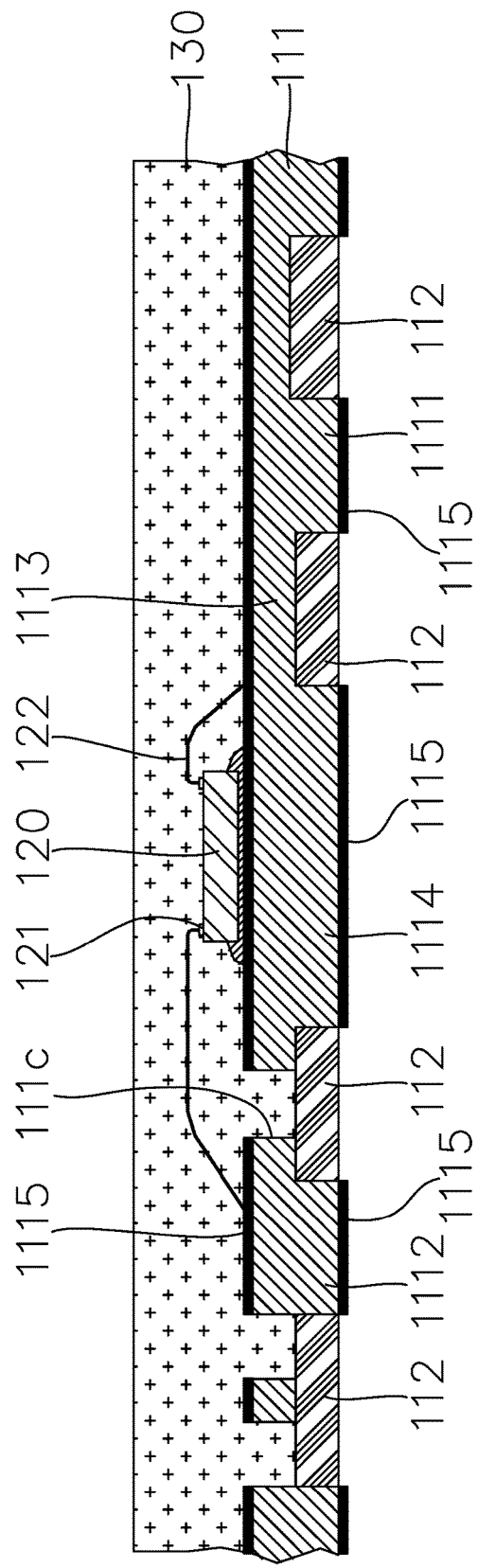

FIGS. 2F and 2F-1 show semiconductor device 100 at a later stage of manufacture.

In the example shown in FIGS. 2F and 2F-1, body encapsulant 130 can be formed to cover substrate 110 and electronic component 120. Body encapsulant 130 can be in contact with upper side of substrate 110 and can be formed to cover lateral sides of electronic component 120. Body encapsulant 130 can fill cavity 111c of substrate 110. In some examples, body encapsulant 130 can comprise or be referred to as an upper encapsulant, a molding part, a sealing part, an encapsulation part, or a protection part. In some examples, body encapsulant 130 can comprise a mold compound, a polymer, or a resin with filler. In some examples, the material of body encapsulant 130 can be similar to the material of dielectric structure 112.

In some examples, body encapsulant 130 can be formed by film assist molding, compression molding, transfer molding, liquid encapsulant molding, vacuum lamination, or paste printing. The thickness of body encapsulant 130 can be greater than the overall thickness of the electronic component 120. Body encapsulant 130 can be formed to cover substrate 110 and electronic component 120 to protect substrate 110 and electronic component 120 from electrical elements or environments. The thickness of body encapsulant 130 can range from approximately 0.2 mm (millimeter) to 10 mm in some examples.

FIGS. 2G and 2G-1 show semiconductor device 100 at a later stage of manufacture. In the example shown in FIGS. 2G and 2G-1, body encapsulant 130 and substrate 110 can be singulated to separate individual semiconductor devices 100A. When separating into individual semiconductor devices 100A, edge lead 1111 in conductive structure 111 of substrate 110 can be exposed at the lateral side of individual semiconductor device 100A, and inner lead 1112 can be located inside, covered from the lateral side of individual semiconductor device 100A by body encapsulant 130 and dielectric structure 112.

In some examples, individual semiconductor device 100A can expose the lateral sides of edge lead 1111. For example, if cavity 111a is not provided along an outer end of edge lead 1111, the entire lateral side of edge lead 1111 can be exposed.

In some examples, individual semiconductor device 100A can expose a lateral side of edge lead lip 1111a where edge lead 1111 has edge lead lip 1111a at an edge of edge lead 1111. For example, if cavity 111a is provided along an outer edge of edge lead 1111, edge lead 1111 can have edge lead lip 1111a laterally exposed and the lower rest of edge lead 1111 can remain laterally covered by dielectric structure 112.

In some examples, the singulation process of separating each semiconductor device 100A into individual semiconductor devices 100A can comprise removing respective portions by a diamond wheel, a laser beam, or etching.

Figure 2H:
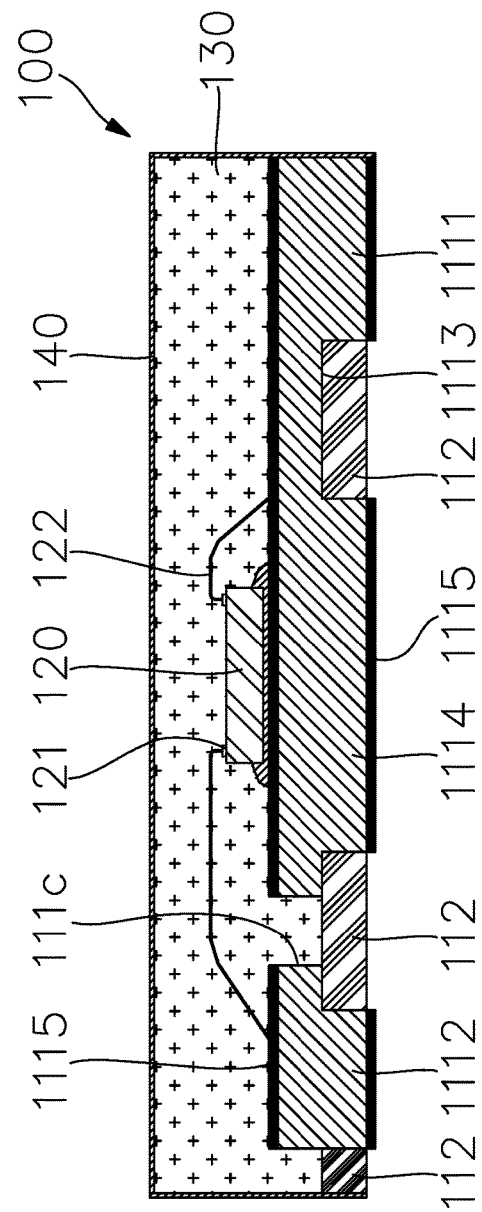
Figures 1, 2H:
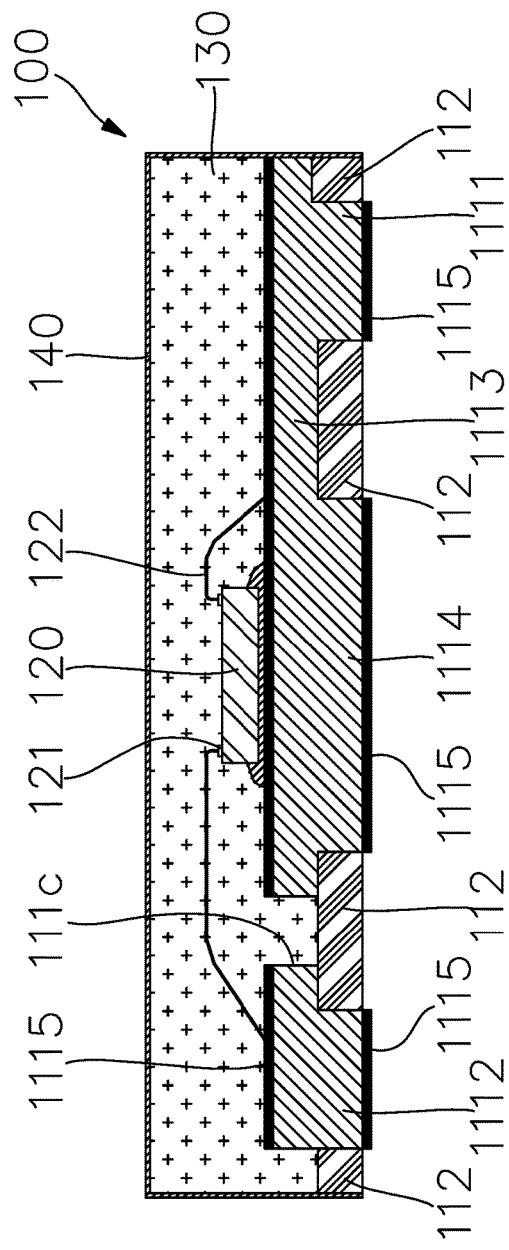

FIGS. 2H and 2H-1 show semiconductor device 100 at a later stage of manufacture. In the example shown in FIGS. 2H and 2H-1, conductive cover 140 can be formed to cover the upper and lateral sides of individual semiconductor device 100A. Conductive cover 140 can contact the upper and lateral sides of body encapsulant 130 and the lateral side of substrate 110 with a uniform thickness. Conductive cover 140 can also contact edge lead 1111 of substrate 110. In some examples, edge lead 1111 in contact with conductive cover 140 can comprise or be referred to as a ground lead or shield lead. Conductive cover 140 can be made of a conductive material to shield electromagnetic interference induced to electronic component 120 from the outside. In some examples, conductive cover 140 can comprise or be referred to as a conformal shield, conformal conductor, lid, shield, EMI shield, or heat shield. In some examples, conductive cover 140 can comprise Ag, Cu, Al, Ni, Pd, or chromium (Cr). In some examples, conductive cover 140 can be formed by sputtering, printing, coating, spraying, or plating. The thickness of conductive cover 140 can be approximately 0.1 μm to 10 μm.

The left side of inner lead 1112 shown in FIGS. 2H and 2H-1 is an example of an inner lead outward side. The right side of inner lead 1112 is an example of an inner lead inward side. The top side and the bottom side of inner lead 1112 are examples of an inner lead top side and an inner lead bottom side. The right side of edge lead 1111 shown in FIGS. 2H and 2H-1 is an example of an edge lead outward side. The left side of edge lead 1111 is an example of an edge lead inward side. The top side and the bottom side of edge lead 1111 are examples of an edge lead top side and an edge lead bottom side. In addition, as shown in FIGS. 2H and 2H-1, dielectric structure 112 and body encapsulant 130 form a lateral interface at the inner lead 1112 outward side and the lateral interface is below the top side of inner lead 1112. Also, as shown in FIGS. 2H and 2H-1, conductive cover 140 overlaps the lateral interface between body encapsulant 130 and dielectric structure 112.

Completed semiconductor device 100 can comprise substrate 110, electronic component 120, body encapsulant 130, and conductive cover 140. Substrate 110 of completed semiconductor device 100 can comprise conductive structure 111 and dielectric structure 112, and conductive structure 111 can comprise edge lead 1111, inner lead 1112, trace 1113 and paddle 1114. In some examples, edge lead 1111, inner lead 1112, and paddle 1114 of substrate 110 can be referred to as external input/output terminals of semiconductor device 100.

FIGS. 5A, 5B, and 5C show cross-sectional views and a bottom view of example semiconductor device 200. FIG. 5A is a cross-sectional view taken along either line D-D' or D-DD" in FIG. 5C, and FIG. 5B is a cross-sectional view taken along either line E-E' or E-EE" in FIG. 5C.

In the example shown in FIGS. 5A to 5C, semiconductor device 200 can be similar to the semiconductor device 100 described for FIGS. 1-4, and can comprise substrate 210, electronic component 220, body encapsulant 130, and conductive cover 140.

Substrate 210 can be similar to substrate 110 of semiconductor device 100 (FIGS. 1-4) and can comprise conductive structure 211 and dielectric structure 212. Conductive structure 211 can be similar to conductive structure 111 and can comprise edge lead 2111, inner lead 2112, trace 2113, and pad 2114, similar to edge lead 1111, inner lead 1112, trace 1113, or paddle 1114 of conductive structure 111. In the present example, pads 2114 are configured to individually couple with respective component interconnects 222 of electronic component 220. FIG. 5C illustrates a region where conductive structure 211 is located over dielectric structure 212 as a hatch.

Electronic component 220 can be similar to electronic component 120 (FIG. 1), and comprises component terminals 121 and component interconnects 222. Component interconnects 222 can be similar to component interconnects 122 (FIG. 1), and can comprise bumps, pillars, or solder tips in some examples.

Substrate 210, body encapsulant 130, and conductive cover 140 can comprise or be referred to as semiconductor package 201 or package 201. Semiconductor package 201 can be similar to semiconductor package 101.

FIGS. 6A, 6A-1, 6B, 6B-1, 6C, 6C-1, 6D, 6D-1, 6E, 6E-1, 6F, 6F-1, 6G, and 6G-1 show a cross-sectional view of a method for manufacturing example semiconductor device 200. FIGS. 6A, 6B, 6C, 6D, 6E, 6F, and 6G are cross-sectional views illustrating a method for manufacturing a cross-section taken along either of lines D-D' or D-D" of semiconductor device 200 shown in FIG. 5C. FIGS. 6A-1, 6B-1, 6C-1, 6D-1, 6E-1, 6F-1, and 6G-1 are cross-sectional views illustrating a method for manufacturing a cross-section taken along either of lines E-E' or E-E" of semiconductor device 200 shown in FIG. 5C.

FIGS. 6A and 6A-1 show cross-sectional views of semiconductor device 200 at an early stage of manufacture. In the example shown in FIGS. 6A and 6A-1, cavity 211a can be formed by removing a portion of conductive structure 211, from lower side 211y upward to a predetermined depth. FIG. 7A generally shows a region where cavity 211a is formed in conductive structure 211 as a hatch. In some examples, conductive structure 211 having cavity 211a formed therein can comprise corresponding elements, features, materials, or manufacturing methods similar to previously described for conductive structure 111. For example, lead 211b of conductive structure 211 can be similar to lead 111b of conductive structure 111 shown in FIG. 2B. In the present example, cavity 211a can also be provided under pad 2114 inwards of conductive structure 211.

Figure 6B:
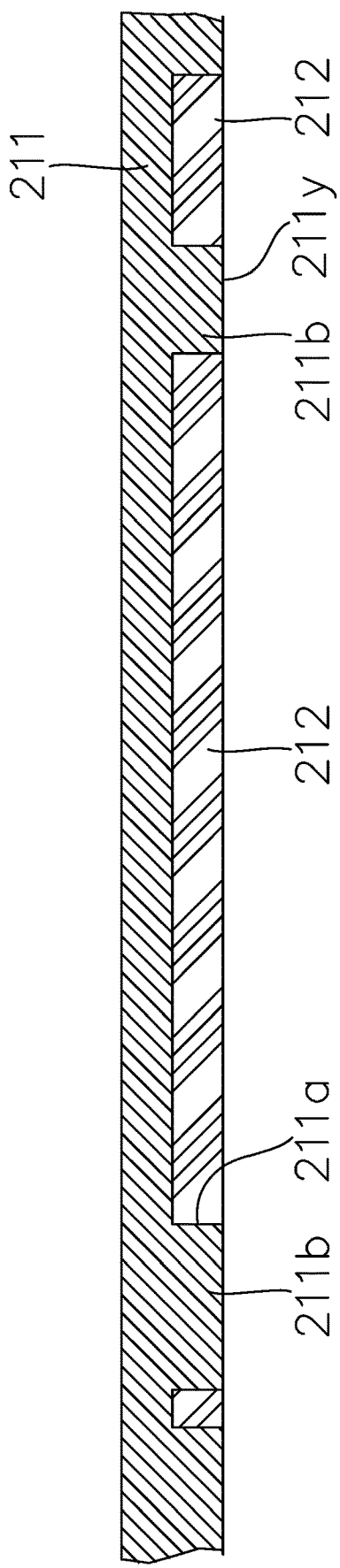
Figures 1, 6B:
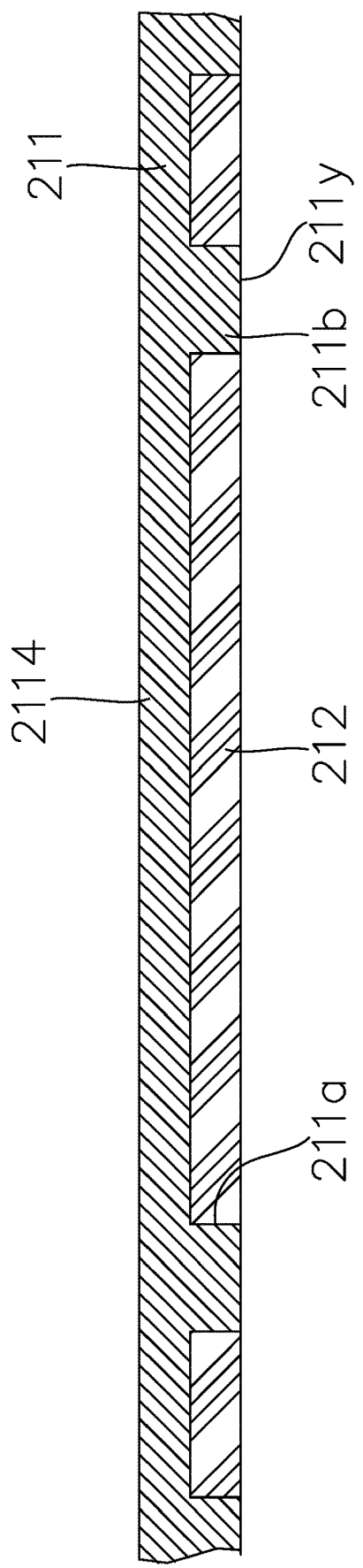
Figure 7A:
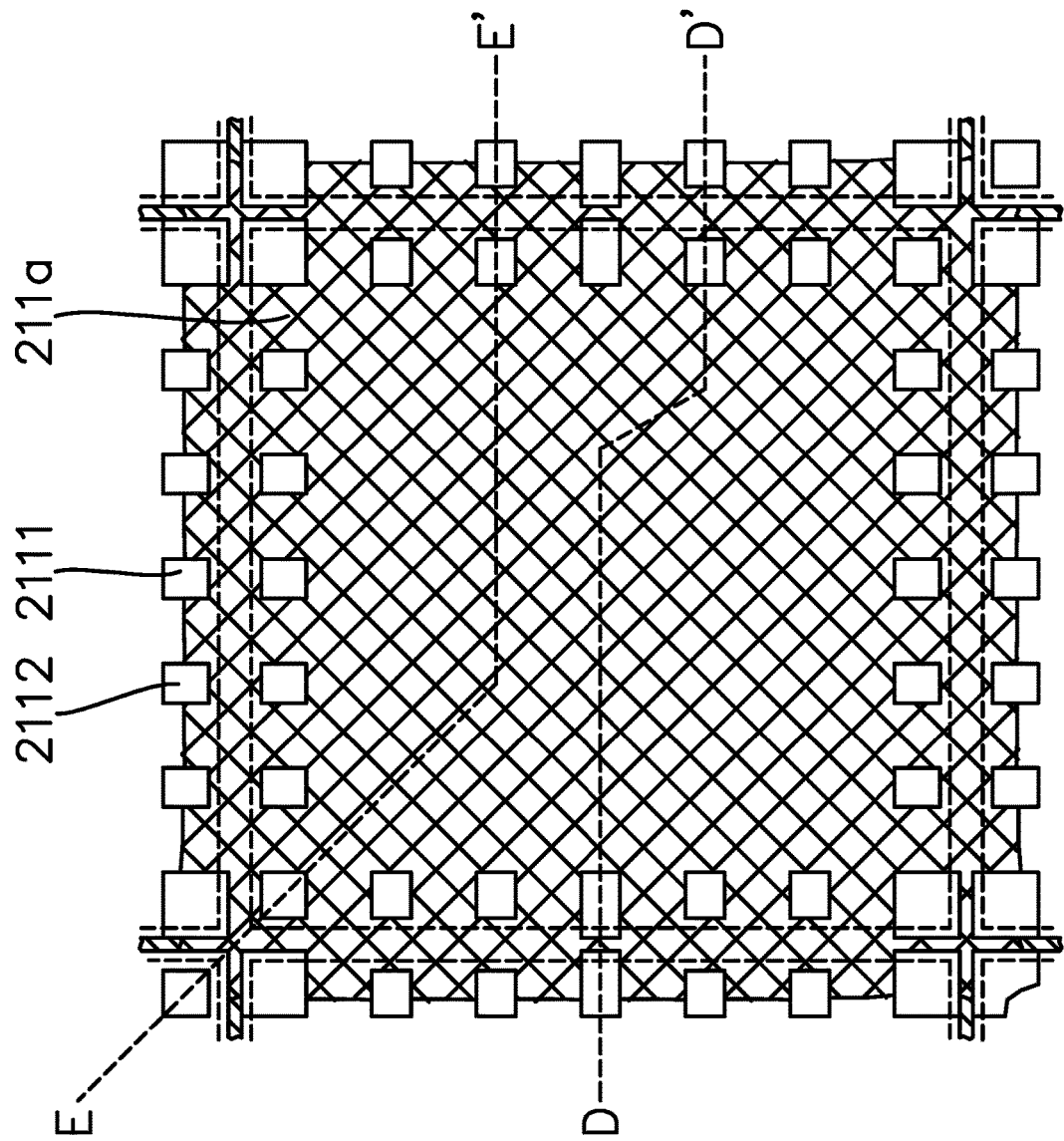
FIG. 7A shows a bottom view of an example semiconductor device.

FIGS. 6B and 6B-1 show semiconductor device 200 at a later stage of manufacture. In the example shown in FIGS. 6B and 6B-1, dielectric structure 212 can be filled in cavity 211a of conductive structure 211. In some examples, dielectric structure 212 can comprise corresponding elements, features, materials, or methods of manufacture similar to those described for dielectric structure 112. Dielectric structure 212 can be provided between leads 211b of conductive structure 211. In the present example, dielectric structure 212 can be provided to cover a lower portion of pad 2114. For example, the lower side of pad 2114 can be in contact with the upper side of dielectric structure 212.

Figure 8A:
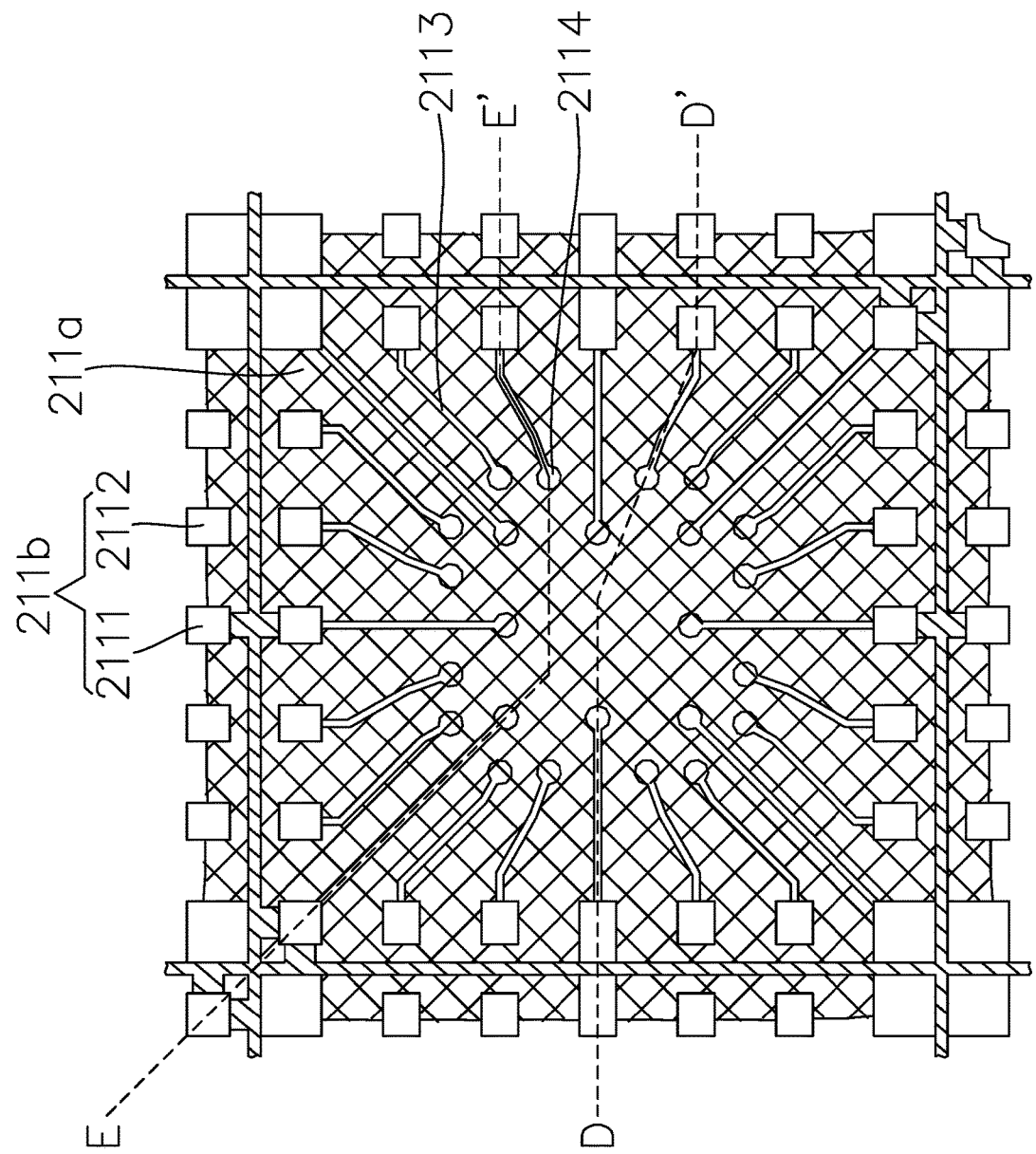
FIG. 8A shows a bottom view of an example semiconductor device.

FIGS. 6C, and 6C-1 show semiconductor device 200 at a later stage of manufacture. In the example shown in FIGS. 6C, 6C-1, cavity 211c can be formed by removing portions of conductive structure 211 from upper side 211x downward to a predetermined depth. FIG. 8A generally shows a region where cavity 211*c* is formed in conductive structure 211 as a hatch. In some examples, conductive structure 211 can comprise corresponding elements, features, materials, or manufacturing methods similar to previously described conductive structure 111. For example, lead 211*b* and trace 2113 of conductive structure 211 can be similar to lead 111*b* and trace 1113 of conductive structure 111. Leads 211*b* can comprise edge lead 2111 and inner lead 2112.

In the present example, adjacent pads 2114 or adjacent leads 211*b* can be separated from each other by cavity 211*c*. For example, cavity 211*c* can separate multiple pads 2114 arranged in a ring shape so as to be spaced apart from each other. Pads 2114 can be connected to respective leads 211*b* by traces 2113. Trace 2113 can be similar to trace 1113 of conductive structure 111. In some examples, cavity 211*c* can also be provided between leads 211*b* and edges of conductive structure 111. Portions of the upper side of dielectric structure 212 can be exposed by cavity 211*c* from the upper portion of conductive structure 211.

In some examples, conductive coating 2115 can be provided on the lower sides of leads 211*b*, respectively. In some examples, conductive coating 2115 can be provided before cavity 211*c* is formed. For example, conductive coating 2115 can be applied after dielectric structure 212 is formed. Conductive coating 2115 can be similar to corresponding elements, features, materials, or methods of manufacture similar to previously described conductive coating 1115. In some examples, conductive coating 2115 provided on the lower sides of leads 211*b* can be similar to conductive coating 1115 provided on the lower sides of leads 111*b*. Optionally, conductive coating 2115 can be provided on some or all portions of the top of conductive structure 211, such as on the top of pads 2114. In some examples, conductive coating 2115 under leads 211*b* can comprise a different layer or material than conductive coating 2115 over pads 2114.

Completed substrate 210 can comprise conductive structure 211 and dielectric structure 212. Conductive structure 211 can comprise leads 211*b*, traces 2113 and pads 2114. In some examples, conductive structure 211 can comprise conductive coating 2115. Completed substrate 210 can be similar to substrate 110.

FIGS. 6D and 6D-1 show semiconductor device 200 at a later stage of manufacture. In the example shown in FIGS. 6D and 6D-1, component interconnects 222 can couple component terminals 221 of electronic component 220 to pads 2114 of conductive structure 211 of substrate 210. Component terminals 221 can be provided in row and/or column directions along an edge of lower side 220*y* of electronic component 220. Component terminal 221 can be similar to the previously described component terminal 121.

In some examples, pick-and-place equipment can pick up electronic component 220 and can place it over pad 2114 of substrate 210. Component interconnect 222 can be placed on the upper side of pad 2114 of conductive structure 211. Subsequently, component interconnect 222 of electronic component 220 can be secured to pad 2114 of substrate 210 through a mass reflow, thermal compression, or laser assisted bonding process. Multiple component interconnects 222 can be connected to respective multiple pads 2114.

In some examples, electronic component 220 can comprise or be referred to as a semiconductor die, a semiconductor chip, or a semiconductor package. In some examples, component terminal 221 can comprise component interconnect 222, and can be connected to pad 2114 of substrate 210 through component interconnect 222. In some examples, component interconnect 222 can comprise or be referred to as a conductive pillar, a conductive post, a conductive bump, or a solder. For example, component interconnect 222 can comprise Sn, Ag, Pb, Cu, Sn—Pb, Sn37-Pb, Sn95-Pb, Sn—Pb—Ag, Sn—Cu, Sn—Ag, Sn—Au, Sn—Bi or Sn—Ag—Cu. The overall thickness of electronic component 220 can range from approximately 50 μm to 500 μm.

FIGS. 6E and 6E-1 show semiconductor device 200 at a later stage of manufacture. In the example shown in FIGS. 6E and 6E-1, body encapsulant 130 can be formed to cover substrate 210 and electronic component 220. In some examples, the upper portion of body encapsulant 130 can be removed or can be left out to expose the top side of electronic component 220. Body encapsulant 130 can be removed by general grinding, chemical etching, or the like. The upper side of body encapsulant 130 can be substantially coplanar with the upper side of electronic component 220.

FIGS. 6F and 6F-1 show semiconductor device 200 at a later stage of manufacture. In the example shown in FIG. 6F, body encapsulant 130 and substrate 210 can be singulated to separate individual semiconductor devices 200A. The process where body encapsulant 130 and substrate 210 are singulated can be similar to that described for encapsulant 130 and substrate 110 are in FIGS. 2G and 2G-1.

When individual semiconductor devices 200A are separated, some of leads 211*b* of conductive structure 211 of substrate 210 can be exposed at the lateral side of substrate 210 and body encapsulant 130. For example, leads 211*b* can comprise edge lead 2111 exposed at a lateral side of substrate 210 and body encapsulant 130, and inner lead 2112 that is not exposed at a lateral side of substrate 210 and body encapsulant 130. In some examples, the outer end of inner lead 2112 can be covered by body encapsulant 130 and dielectric structure 212. In some examples, the lateral side of edge lead 2111 can be coplanar with the lateral sides of body encapsulant 130 and dielectric structure 212. Edge lead 2111 and inner lead 2112 can be similar to edge lead 1111 and inner lead 1112 of previously described conductive structure 111.

In some examples, edge lead 2111 can comprise edge lead lip 2111*a* provided on the upper side of dielectric structure 112. Edge lead lip 2111*a* can be similar to edge lead lip 1111*a* of previously described edge lead 1111. In some examples, substrate 210 and body encapsulant 130 can expose edge lead lip 2111*a* of edge lead 2111. For example, edge lead 2111 can have edge lead lip 2111*a* laterally exposed and the lower portion of edge lead 2111 can remain laterally covered by dielectric 212.

Figure 6G:
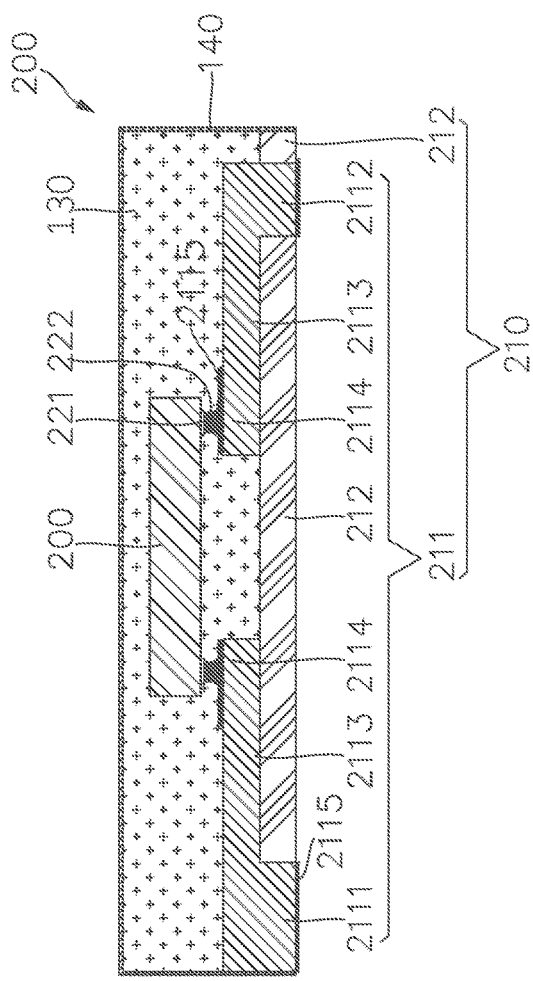
Figures 1, 6G:
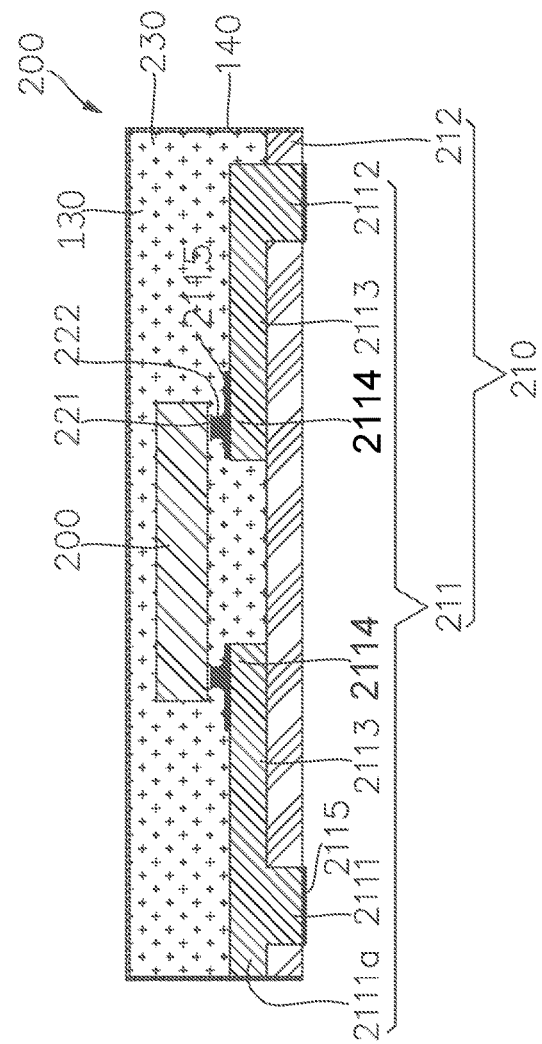

FIGS. 6G and 6G-1 show semiconductor device 200 at a later stage of manufacture. In the example shown in FIGS. 6G and 6G-1, conductive cover 140 can be formed to cover the upper and lateral sides of individual semiconductor device 200A. Conductive cover 140 can be in contact with the upper and lateral sides of body encapsulant 130 and the lateral side of substrate 210 with a uniform thickness. Conductive cover 140 can be in contact with edge lead 2111 of substrate 210. Conductive cover 140 can be similar to, or can be applied as described for, conductive cover 140 on semiconductor device 100.

The right side of inner lead 2112 shown in FIGS. 6G and 6G-1 is an example of an inner lead outward side. The lower left side of inner lead 2112 is an example of an inner lead inward side. The top side and the bottom side of inner lead 2112 are examples of an inner lead top side and an inner lead bottom side. The left side of edge lead 2111 shown in FIGS. 6G and 6G-1 is an example of an edge lead outward side. The lower right side of edge lead 2111 is an example of an edge lead inward side. The top side and the bottom side of edge lead 2111 are examples of an edge lead top side and an edge lead bottom side. In addition, as shown in FIGS. 6G and 6G-1, dielectric structure 212 and body encapsulant 230 form a lateral interface at the inner lead 2112 outward side and the lateral interface is below the top side of inner lead 2112. Also, as shown in FIGS. 6G and 6G-1, conductive cover 140 overlaps the lateral interface between body encapsulant 230 and dielectric structure 212.

Completed semiconductor device 200 can comprise substrate 210, electronic component 220, body encapsulant 130, and conductive cover 140. Substrate 210 of completed semiconductor device 200 can comprise conductive structure 211 and dielectric structure 212, and conductive structure 211 can comprise edge lead 2111, inner lead 2112, trace 2113 and pad 2114. In some examples, edge lead 2111 and inner lead 2112 of substrate 210 can be referred to as external input/output terminals of semiconductor device 200.

Figure 9A:
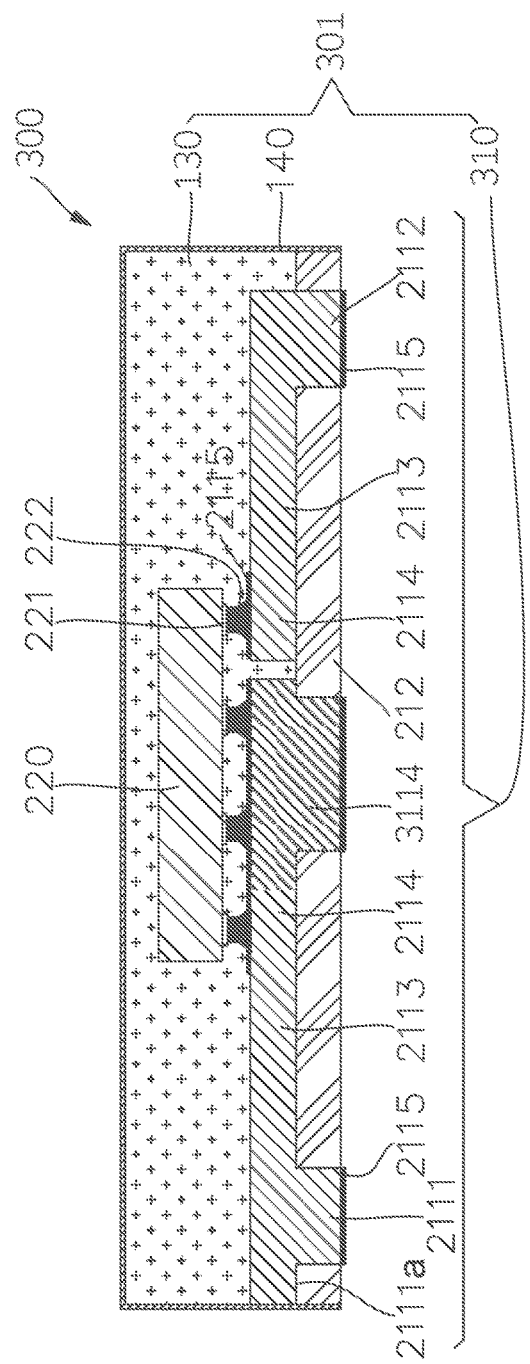
FIGS. 9A, 9B, and 9C show cross-sectional views and a bottom view of an example semiconductor device.
Figure 9B:
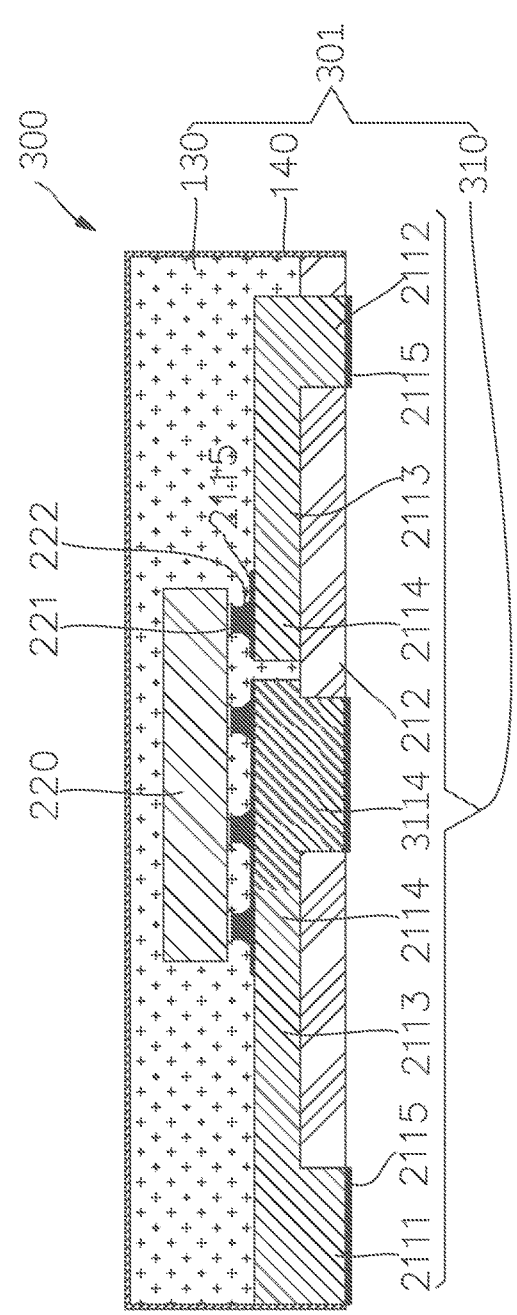
Figure 9C:
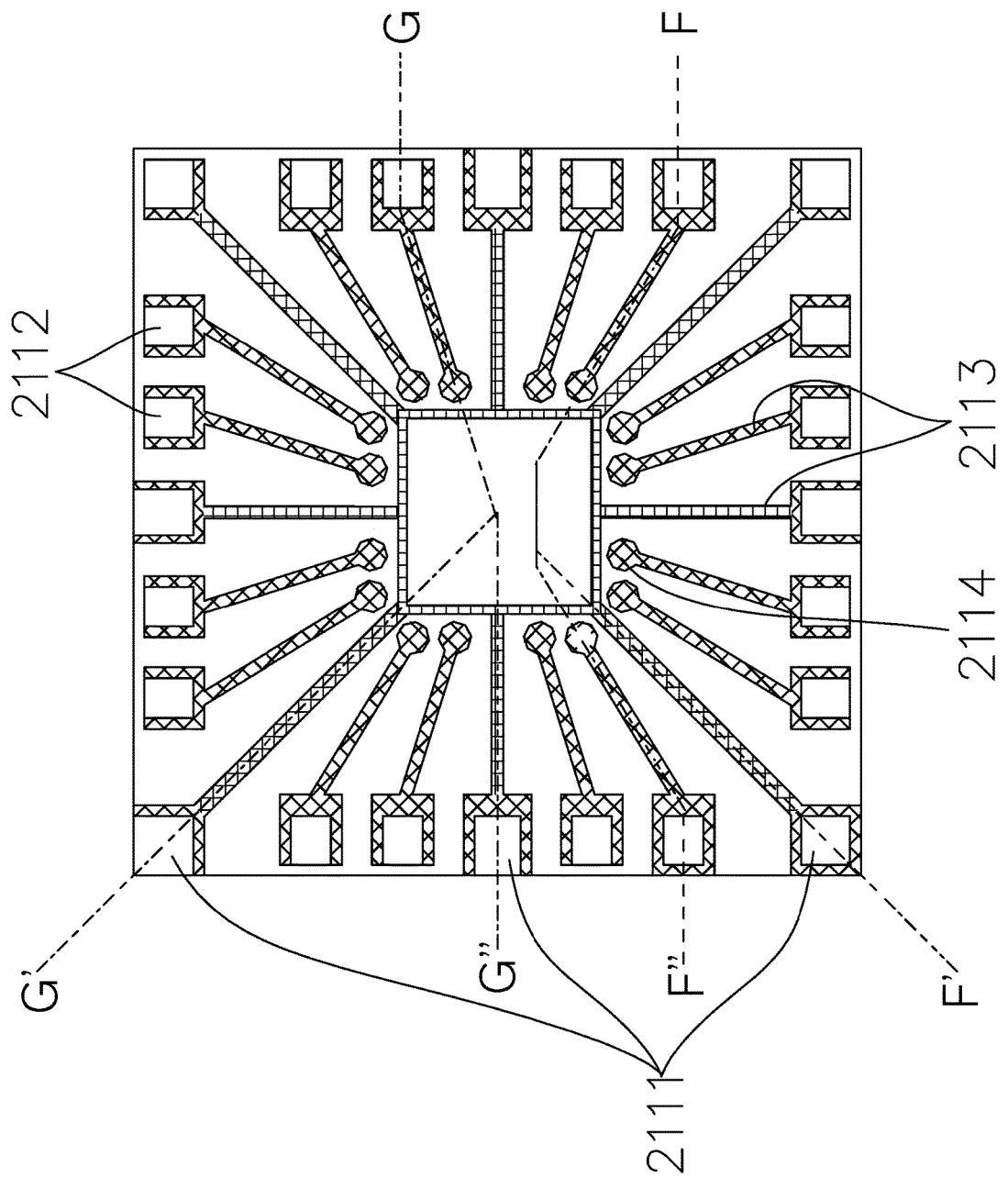

FIGS. 9A-9B and 9C show respective cross-sectional and bottom views of example semiconductor device 300. FIG. 9A is a cross-sectional view taken along either of lines F-F' or F-F" in FIG. 9C. FIG. 9B is a cross-sectional view taken along either of lines G-G' or G-G" in FIG. 9C. Substrate 310, body encapsulant 130, and conductive cover 140 can comprise or be referred to as semiconductor package 301 or package 301. Semiconductor package 301 can be similar to semiconductor package 101 or 201.

In the example shown in FIGS. 9A, 9B, 9C, semiconductor device 300 can comprise substrate 310, electronic component 220, body encapsulant 130, and conductive cover 140. In some examples, semiconductor device 300 can comprise corresponding elements, features, materials, or methods of manufacture similar to those described with respect to semiconductor device 100 or semiconductor device 200. For example, substrate 310, electronic component 220, body encapsulant 130, and conductive cover 140 of semiconductor device 300 can correspond to or be similar to substrate 210, electronic component 220, body encapsulant 130 and conductive cover 140 of semiconductor device 200. The different elements of substrate 310 can be similar to corresponding elements of substrate 210 or 110 of respective semiconductor devices 200 or 100.

In the present example, semiconductor device 300 can comprise paddle 3114 positioned inwards of substrate 310, flanked by pads 2114. In some examples, paddle 3114 can be similar to paddle 1114 of substrate 110 of semiconductor device 100. Electronic component 220 can be coupled to paddle 3114 through one or more component interconnects 222. Paddle 3114 can be coupled to conductive cover 140 via one or more edge leads 2111 through respective traces 2113. Paddle 3114 can be referred to as or comprise a ground pad. The lower side of paddle 3114 can be exposed at the bottom of semiconductor device 300, and thus heat dissipation and electrical grounding can be advantageously achieved.

The right side of inner lead 2112 shown in FIGS. 9A and 9B is an example of an inner lead outward side. The lower left side of inner lead 2112 is an example of an inner lead inward side. The top side and the bottom side of inner lead 2112 are examples of an inner lead top side and an inner lead bottom side. The left side of edge lead 2111 shown in FIGS. 9A and 9B is an example of an edge lead outward side. The lower right side of edge lead 2111 is an example of an edge lead inward side. The top side and the bottom side of edge lead 2111 are examples of an edge lead top side and an edge lead bottom side. In addition, as shown in FIGS. 9A and 9B, dielectric structure 212 and body encapsulant 130 form a lateral interface at the inner lead 2112 outward side and the lateral interface is below the top side of inner lead 2112. Also, as shown in FIGS. 9A and 9B, conductive cover 140 overlaps the lateral interface between body encapsulant 130 and dielectric structure 212.

The present disclosure includes reference to certain examples, however, it will be understood by those skilled in the art that various changes can be made and equivalents can be substituted without departing from the scope of the disclosure. In addition, modifications can be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A packaged electronic device, comprising:
   a molded substrate comprising:
      a conductive structure comprising:
         an edge lead comprising an edge lead outward side and an edge lead inward side opposite to the edge lead outward side; and
         an inner lead comprising an inner lead outward side and an inner lead inward side opposite to the inner lead outward side; and
      a substrate encapsulant covering a lower portion of the edge lead inward side, a lower portion of the inner lead inward side, and a lower portion of the inner lead outward side,
      wherein:
         an upper portion of the edge lead outward side and an upper portion of the inner lead outward side are exposed from the substrate encapsulant;
         the edge lead adjoins a first lateral side of the molded substrate; and
         the inner lead is an outermost lead at a second lateral side of the molded substrate;
   an electronic component coupled to the edge lead and the inner lead;
   a body encapsulant covering the electronic component and portions of the conductive structure, wherein:
      the body encapsulant comprises a body encapsulant top side and body encapsulant sides;
      the upper portion of the edge lead outward side is exposed from one of the body encapsulant sides; and
      the body encapsulant covers the upper portion of the inner lead outward side and the upper portion of the inner lead inward side; and
   a conductive cover over the body encapsulant top side, the body encapsulant sides, and outer sides of the substrate encapsulant,
      wherein the conductive cover contacts the upper portion of the edge lead outward side.

2. The packaged electronic device of claim 1, wherein:
   a lower portion of the edge lead outward side is exposed from the substrate encapsulant and exposed from the body encapsulant; and
   the conductive cover contacts the lower portion of the edge lead outward side.

3. The packaged electronic device of claim 1, wherein:
   a lower portion of the edge lead outward side is inset with respect to the upper portion of the edge lead outward side; and
   the lower portion of the edge lead outward side is covered by the substrate encapsulant.

4. The packaged electronic device of claim 1, wherein:
the conductive structure comprises a trace coupled to an upper portion of the edge lead inward side;
the trace has a trace top side and a trace bottom side opposite to the trace top side; and
the substrate encapsulant covers the trace bottom side.

5. The packaged electronic device of claim 1, wherein:
the conductive structure comprises a trace and a pad;
the edge lead has a first thickness;
the trace has a second thickness less than the first thickness;
the electronic component is flip-chip attached to the pad; and
the trace couples the pad to an upper portion of the edge lead inward side.

6. The packaged electronic device of claim 1, wherein:
the conductive structure comprises traces, pads, and a paddle;
the paddle is flanked by the pads;
the electronic component is flip-chip attached to the paddle and the pads;
a first trace connects the paddle to the edge lead;
a second trace connects a first pad to the inner lead;
the paddle comprises a paddle bottom side;
the paddle bottom side is exposed from the substrate encapsulant;
the first pad comprises a first pad bottom side; and
the substrate encapsulant covers the first pad bottom side.

7. A packaged electronic device, comprising:
a pre-molded substrate comprising:
a conductive structure comprising:
an edge lead comprising an edge lead outward side, an edge lead inward side opposite to the edge lead outward side, an edge lead top side, and an edge lead bottom side opposite to the edge lead top side; and
an inner lead comprising an inner lead outward side, an inner lead inward side opposite to the inner lead outward side, an inner lead top side, and an inner lead bottom side opposite to the inner lead top side;
a paddle;
pads flanking the paddle including a first pad; and
traces including a first trace coupling the paddle to the edge lead and a second trace coupling the first pad to the inner lead; and
a substrate encapsulant covering the conductive structure, wherein:
the first pad comprises a first pad top side and a first pad bottom side;
the first pad top side is exposed from the substrate encapsulant;
an upper portion of the edge lead outward side and an upper portion of the inner lead outward side are exposed from the substrate encapsulant;
a lower portion of the edge lead inward side, a lower portion of the inner lead inward side, and a lower portion of the inner lead outward side are covered by the substrate encapsulant; and
the edge lead top side, the edge lead bottom side, the inner lead top side, and the inner lead bottom side are exposed from the substrate encapsulant;
an electronic component coupled to the pre-molded substrate;
a body encapsulant covering the electronic component and portions of the conductive structure, wherein:
the body encapsulant has a body encapsulant top side and body encapsulant sides;
the upper portion of the edge lead outward side is exposed from one of the body encapsulant sides; and
the body encapsulant covers the upper portion of the inner lead outward side, the upper portion of the inner lead inward side, the inner lead top side, and the edge lead top side; and
a conductive cover over the body encapsulant top side, the body encapsulant sides, and outer sides of the substrate encapsulant, wherein the conductive cover contacts the upper portion of the edge lead outward side.

8. The packaged electronic device of claim 7, wherein:
a lower portion of the edge lead outward side is exposed from the substrate encapsulant and exposed from the body encapsulant; and
the conductive cover contacts the lower portion of the edge lead outward side.

9. The packaged electronic device of claim 7, wherein:
a lower portion of the edge lead outward side is inset with respect to the upper portion of the edge lead outward side so that upper portion of the edge lead outward side forms an edge lead lip; and
the lower portion of the edge lead outward side is covered by the substrate encapsulant.

10. The packaged electronic device of claim 7, wherein:
the first trace has a first trace top side and a first trace bottom side opposite to the first trace top side; and
the substrate encapsulant covers the first trace bottom side.

11. The packaged electronic device of claim 7, wherein:
the edge lead has a first thickness; and
the first trace has a second thickness less than the first thickness.

12. The packaged electronic device of claim 7, wherein:
the electronic component is flip-chip attached to the paddle and the pads.

13. The packaged electronic device of claim 7, wherein:
the substrate encapsulant covers the first pad bottom side.

14. The packaged electronic device of claim 7, wherein:
the paddle comprises a paddle bottom side; and
the paddle bottom side is exposed from the substrate encapsulant.

15. The packaged electronic device of claim 7, wherein:
the substrate encapsulant and the body encapsulant form a lateral interface at the inner lead outward side that is below the inner lead top side; and
the conductive cover vertically overlaps the lateral interface.

16. A method for manufacturing a packaged electronic device, comprising:
providing a molded substrate comprising:
a conductive structure comprising:
an edge lead comprising an edge lead outward side and an edge lead inward side opposite to the edge lead outward side; and
an inner lead comprising an inner lead outward side and an inner lead inward side opposite to the inner lead outward side; and
a substrate encapsulant covering a lower portion of the edge lead inward side, a lower portion of the inner lead inward side, and a lower portion of the inner lead outward side, wherein;
an upper portion of the edge lead outward side and an upper portion of the inner lead outward side are exposed from the substrate encapsulant;
the edge lead adjoins a first lateral side of the molded substrate; and
the inner lead is an outermost lead at a second lateral side of the molded substrate;
coupling an electronic component to the edge lead and the inner lead;
providing a body encapsulant covering the electronic component and portions of the conductive structure, wherein:
the body encapsulant has a body encapsulant top side and body encapsulant sides;
the upper portion of the edge lead outward side is exposed from one of the body encapsulant sides; and
the body encapsulant covers the upper portion of the inner lead outward side and the upper portion of the inner lead inward side; and
providing a conductive cover over the body encapsulant top side, the body encapsulant sides, and outer sides of the substrate encapsulant,
wherein the conductive cover contacts the upper portion of the edge lead outward side.

17. The method of claim 16, wherein:
providing the molded substrate comprises providing a lower portion of the edge lead outward side exposed from the substrate encapsulant and exposed from the body encapsulant; and
providing the conductive cover providing the conductive cover contacting the lower portion of the edge lead outward side.

18. The method of claim 16, wherein:
providing the molded substrate comprises:
providing a lower portion of the edge lead outward side inset with respect to the upper portion of the edge lead outward side; and
providing the substrate encapsulant covering the lower portion of the edge lead outward side.

19. The method of claim 16, wherein:
providing the molded substrate comprises providing the conductive structure comprising a trace and a pad;
the trace couples the pad to an upper portion of the edge lead inward side; and
coupling the electronic component comprising flip-chip attaching the electronic component to the pad.

20. The method of claim 16, wherein:
providing the molded substrate comprises providing the conductive structure comprising traces, pads, and a paddle;
the paddle is flanked by the pads;
a first trace connects the paddle to the edge lead;
a second trace connects a first pad to the inner lead;
the paddle comprises a paddle bottom side exposed from the substrate encapsulant;
the first pad comprises a first pad bottom side covered by substrate encapsulant; and
coupling the electronic component comprises flip-chip attaching the electronic component to the paddle and the pads.

* * * * *